United States Patent
Lee

(10) Patent No.: US 9,941,014 B2
(45) Date of Patent: Apr. 10, 2018

(54) NONVOLATILE MEMORY DEVICE, NONVOLATILE MEMORY SYSTEM INCLUDING THE SAME, AND METHOD OF OPERATING THE SAME

(71) Applicant: SAMSUNG ELECTRONICS CO., LTD., Suwon-si, Gyeonggi-do (KR)

(72) Inventor: ChulHo Lee, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 730 days.

(21) Appl. No.: 14/477,347

(22) Filed: Sep. 4, 2014

(65) Prior Publication Data

US 2015/0186042 A1    Jul. 2, 2015

(30) Foreign Application Priority Data

Jan. 2, 2014    (KR) .................. 10-2014-0000320

(51) Int. Cl.
*G06F 12/02* (2006.01)
*G11C 16/32* (2006.01)
*G11C 11/56* (2006.01)
*G11C 16/10* (2006.01)

(52) U.S. Cl.
CPC .......... *G11C 16/32* (2013.01); *G11C 11/5628* (2013.01); *G11C 16/10* (2013.01); *G11C 2207/2245* (2013.01)

(58) Field of Classification Search
CPC ..... G11C 16/32; G11C 11/5628; G11C 16/10; G11C 2207/2245; G06F 3/06
USPC .......................................................... 711/103
See application file for complete search history.

(56) References Cited

U.S. PATENT DOCUMENTS

| | | | |
|---|---|---|---|
| 6,148,360 A | 11/2000 | Leak et al. | |
| 7,032,081 B1 | 4/2006 | Gefen et al. | |
| 7,869,347 B2 * | 1/2011 | Bell | H04L 45/04 370/218 |
| 8,645,752 B2 | 2/2014 | Ha | |
| 2003/0009600 A1 * | 1/2003 | Koyama | G06F 9/50 719/310 |
| 2004/0255179 A1 * | 12/2004 | Mayer | G06F 9/4406 714/1 |
| 2010/0257308 A1 | 10/2010 | Hsu et al. | |

(Continued)

FOREIGN PATENT DOCUMENTS

| | | |
|---|---|---|
| JP | 2005018650 | 1/2005 |
| JP | 2008034045 | 2/2008 |

*Primary Examiner* — Pierre Miche Bataille
(74) *Attorney, Agent, or Firm* — F. Chau & Associates, LLC

(57) ABSTRACT

A nonvolatile memory device includes a memory cell array having a normal area and a temporary area. A page buffer stores data to be written to the normal area in a normal program operation and store a temporary data to be written to the temporary area in a temporary program operation. A control logic performs the normal program operation including a plurality of program loops. The control logic receives a suspend command before the normal program operation is completed and determines, in response to the suspend command, whether to complete the normal program operation or to suspend the normal operation and perform the temporary program operation based on a reference value representing a time for performing at least one program loop of the plurality of program loops.

19 Claims, 18 Drawing Sheets

(56) References Cited

U.S. PATENT DOCUMENTS

| | | |
|---|---|---|
| 2010/0231204 A1 | 11/2010 | Yano et al. |
| 2011/0055453 A1 | 3/2011 | Bennett |
| 2012/0044764 A1 | 2/2012 | Nakai et al. |
| 2012/0324179 A1 | 12/2012 | Farrell et al. |
| 2013/0067143 A1 | 3/2013 | Hasegawa et al. |
| 2013/0124792 A1 | 5/2013 | Melik-Martirosian et al. |

* cited by examiner

NONVOLATILE MEMORY DEVICE, NONVOLATILE MEMORY SYSTEM INCLUDING THE SAME, AND METHOD OF OPERATING THE SAME

CROSS-REFERENCE TO RELATED APPLICATION

This application claims priority under 35 U.S.C. § 119 to Korean Patent Application No. 10-2014-0000320, filed on Jan. 2, 2014 in the Korean Intellectual Property Office, the disclosure of which is incorporated by reference herein in its entirety.

TECHNICAL FIELD

The present inventive concept relates to a semiconductor storage device, a nonvolatile memory system including the same, and a method of operating the same.

DISCUSSION OF RELATED ART

Semiconductor memory devices are formed of semiconductor materials, such as silicon (Si), germanium (Ge), gallium arsenide (GaAs), indium phosphide (InP), and the like. Semiconductor memory devices are classified into volatile memory devices and nonvolatile memory devices.

Volatile memory devices may lose stored contents when power is not supplied. The volatile memory devices include a static random access memory (SRAM) device, a dynamic random access memory (DRAM) device, a synchronous DRAM (SDRAM) device, etc. The nonvolatile memory devices may retain stored contents when power is not supplied. The nonvolatile memory devices include a read only memory (ROM) device, a programmable ROM (PROM) device, an electrically programmable ROM (EPROM) device, an electrically erasable and programmable ROM (EEPROM) device, a flash memory device, a phase-change RAM (PRAM) device, a magnetic RAM (MRAM) device, a resistive RAM (ReRAM) device, a ferroelectric RAM (FRAM) device, etc.

For nonvolatile memory devices such as flash memory devices, a program or erase operation of nonvolatile memory devices may take longer than a read operation thereof. If a read operation is issued to nonvolatile memory devices operating a program or erase operation, the latency of such read operation may be increased.

SUMMARY

According to an exemplary nonvolatile memory device of the present inventive concept, a memory cell array includes a normal area and a temporary area. A page buffer stores data to be written to the normal area in a normal program operation and store a temporary data to be written to the temporary area in a temporary program operation. A control logic performs the normal program operation including a plurality of program loops. The control logic receives a suspend command before the normal program operation is completed and determines, in response to the suspend command, whether to complete the normal program operation or to suspend the normal operation and perform the temporary program operation based on a reference value representing a time for performing at least one program loop of the plurality of program loops.

According to an exemplary nonvolatile memory system of the present inventive concept, the nonvolatile memory system includes a nonvolatile memory device and a memory controller. The nonvolatile memory device includes a normal area and a temporary area. The nonvolatile memory device performs a normal program operation having program loops on the normal area using data. The nonvolatile memory device performs a temporary program operation on the temporary area using temporary data. A memory controller issues a suspend command to the nonvolatile memory device based on a ready/busy signal from the nonvolatile memory device and a read request from an external device. The nonvolatile memory device detects a number of remaining program loops of the plurality of program loops not executed when the nonvolatile memory device receives the suspend command from the memory controller. The nonvolatile memory device compares the detected number of the remaining program loops with a reference value. The nonvolatile memory device suspends the remaining program loops of the normal program operation and performs the temporary program operation. The nonvolatile memory device updates the data to the temporary data including a verification result of a program loop of the plurality of program loops being performed when the nonvolatile memory device receives the suspend command.

According to an exemplary method of operating a nonvolatile memory in the present inventive concept, data is stored in a page buffer. A normal program operation is performed on a plurality of multi-level memory cells using the data. The normal program operation is performed by iterating a plurality of program loops. A number of the plurality of program loops is M. A suspend command is received while an Nth program loop is running. N is less than M. A temporary program operation is performed on a plurality of single-level memory cells, if a time for completing the temporary program is equal to or less than a time for performing (M−N) program loops not executed before the receiving of the suspend command. (N+1)th program loop is started if the time for completing the temporary program is greater than the time for performing (M−N) program loops.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
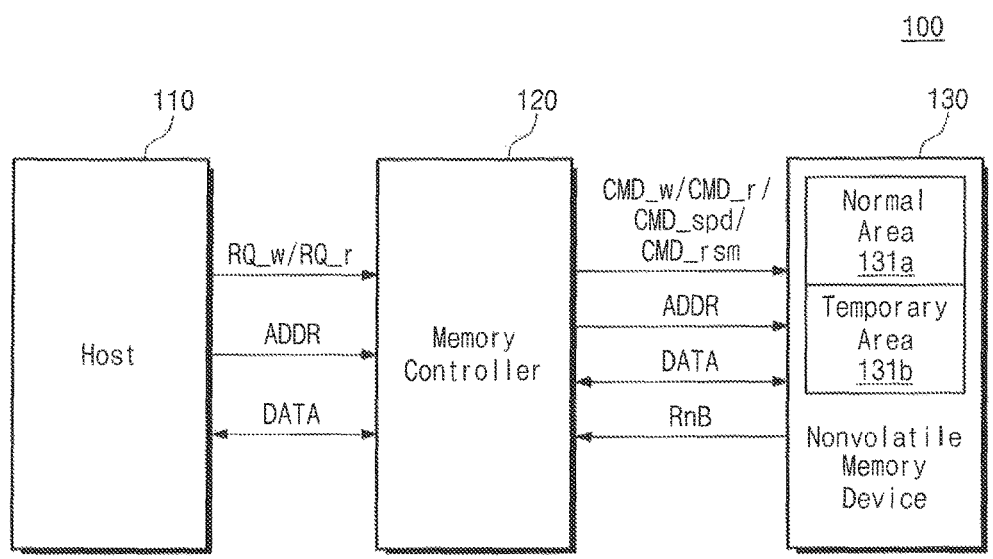
FIG. 1 is a block diagram schematically showing a user system according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

A nonvolatile memory device according to an exemplary embodiment of the inventive concept may receive a program suspend command while programming. The nonvolatile memory device stops a running program or erase operation in response to the program suspend command and performs an operation with high priority. At this time, the nonvolatile memory device stores temporary data (e.g., verification data) to be programmed at a temporary area of a memory cell array.

After performing an operation with high priority, the nonvolatile memory device receives a resume command to resume a suspended program or erase operation. Thus, it is possible to reduce latency of the operation with high priority. Also, as data being programmed is written to a nonvolatile memory cell array, the suspended program or erase operation is resumed without data loss. The suspended operation may occur due to sudden power-off (SPO). Thus, reliability of the nonvolatile memory device is improved.

FIG. 1 is a block diagram schematically showing an exemplary user system according to the inventive concept. Referring to FIG. 1, a user system 100 may be included in Ultra Mobile PC (UMPC), workstation, net-book, PDA, portable computer, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

The user system 100 includes a host 110, a memory controller 120, and a nonvolatile memory device 130. Each of the components 110 to 130 may be provided in the form of a chip, a package, or a module. Alternatively, the memory controller 120 and the nonvolatile memory device 130 may be packaged together according to any of a variety of different packaging technologies to be provided as a nonvolatile memory system. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

According to an exemplary embodiment of the inventive concept, the nonvolatile memory device 130 suspends a running program operation in response to a suspend command CMD_spd. However, the inventive concept is not limited thereto. For example, the nonvolatile memory device 130 suspends a running erase operation in response to the suspend command CMD_spd.

The host 110 transmits write and read requests RQ_w and RQ_r and an address ADDR to the memory controller 120. The host 110 exchanges data with the memory controller 120. The host 110 may exchange data with the memory controller 120, based on at least one of a variety of interface protocols, such as USB (Universal Serial Bus) protocol, MMC (multimedia card) protocol, eMMC (embedded MMC) protocol, PCI (peripheral component interconnection) protocol, PCI-E (PCI-express) protocol, ATA (Advanced Technology Attachment) protocol, Serial-ATA protocol, Parallel-ATA protocol, SCSI (Small computer small interface) protocol, ESDI (enhanced small disk interface) protocol, IDE (Integrated Drive Electronics) protocol, MIPI (Mobile Industry Processor Interface) protocol, UFS (Universal Flash Storage) protocol, NVMe (NonVoltile Memory express) protocol, and so on.

The memory controller 120 controls the nonvolatile memory device 130 in response to the write request RQ_w or the read request RQ_r received from the host 110. For example, the memory controller 120 provides the nonvolatile memory device 130 with a write command CMD_w or a read command CMD_r, in response to the write request RQ_w or the read request RQ_r received from the host 110. The memory controller 120 transmits a suspend command CMD_spd, a resume command CMD_rsm, and an address ADDR. The address ADDR may be a physical address. The memory controller 120 exchanges data with the nonvolatile memory device 130. The memory controller 120 receives a ready/busy signal RnB from the nonvolatile memory device 130.

The nonvolatile memory device 130 performs operations, including write, read, and erase operations, in response to signals from the memory controller 120. The nonvolatile memory device 130 transfers the ready/busy signal RnB to the memory controller 120. The ready/busy signal RnB is a signal indicating whether the nonvolatile memory device 130 is performing an operation. For example, when the nonvolatile memory device 130 is performing a program operation, the ready/busy signal RnB may be set to a busy state (e.g., a logical low level). The ready/busy signal RnB may be set to a ready state (e.g., a logical high level) while the nonvolatile memory device 130 is not performing an operation.

The nonvolatile memory device 130 includes a normal area 131a and a temporary area 131b. Memory cells in the normal area 131a may store data received from the memory controller 120. For example, data received from the memory controller 120 is stored in the normal area 131a. Data updated in a program operation with a program verification result may be temporarily stored in the temporary area 131b when the nonvolatile memory device 130 suspends a running program operation in response to the suspend command CMD_spd. Each memory cell of the normal area 131a may be a multi-level memory cell (MLC) storing at least two data bits, and each memory cell of the temporary area 131b may be a single-level memory cell (SLC) storing one data bit. Alternatively, memory cells of the normal area 131a are configured the same as memory cells of the temporary area 131b.

The temporary area 131b may include some memory blocks of a plurality of memory blocks of the memory cell array 131. Alternatively, the memory cell array 131 may be logically divided into the normal area 131a and the temporary area 131b.

The memory controller 120 provides the nonvolatile memory device 130 with a suspend command CMD_spd in response to a ready/busy signal RnB and a write request RQ_w or a read request RQ_r from the host. While the nonvolatile memory device 130 performs a program operation, the ready/busy signal RnB may have a busy state. The memory controller 120 may receive a read request RQ_r with high priority from the host 110. In this case, the memory controller 120 transmits a suspend command CMD_ spd to the nonvolatile memory device 130 in response to the read request RQ_r. For example, the memory controller 120 transmits the suspend command CMD_spd to the nonvolatile memory device 130 in response to a write or read request RQ_w or RQ_r with high priority that is received during a busy state of the ready/busy signal RnB.

The nonvolatile memory device 130 suspends or completes a running program operation in response to a suspend command CMD_spd. For example, in response to a suspend command CMD_spd, the nonvolatile memory device 130 determines whether the number of remaining program loops of the running program operation is greater than a reference value. The nonvolatile memory device 130 stops the running program operation according to the determination, and the ready/busy signal RnB is set to a ready state. Afterwards, the memory controller 120 transmits a read command CMD_r such that the nonvolatile memory device 130 performs a read operation with high priority.

If a running program operation is stopped or suspended, the nonvolatile memory device 130 temporarily stores data being programmed in the temporary area 131b. The temporary area 131b may be included in the memory cell array. Also, the temporary area 131b may be formed of single-level memory cells. The nonvolatile memory device 130 writes suspend information indicating whether a program operation is suspended, in a portion of the normal area 131a. The portion of the normal area 131a may be a spare area of a page being programmed. Alternatively, the suspend information may be stored in spare cells which are connected to the same word line as memory cells being programmed.

Figure 2:
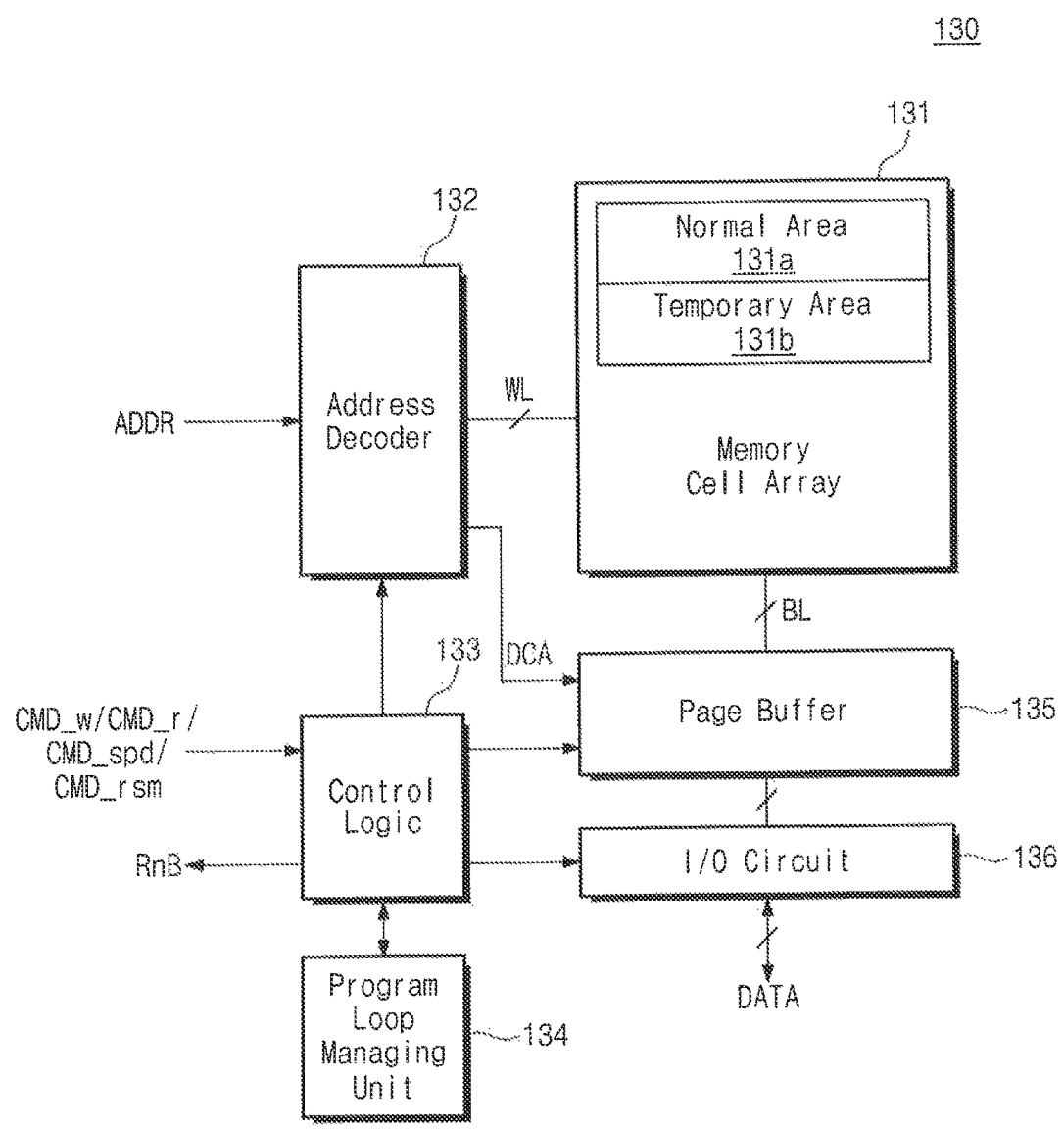
FIG. 2 is a block diagram schematically showing a nonvolatile memory device of FIG. 1, according to an exemplary embodiment of the inventive concept.

FIG. 2 is a block diagram schematically showing a nonvolatile memory device of FIG. 1, according to an exemplary embodiment of the inventive concept. Referring to FIGS. 1 and 2, a nonvolatile memory device 130 includes a memory cell array 131, an address decoder 132, a control logic 133, a program loop managing unit 134, a page buffer 135, and an input/output circuit 136.

The memory cell array 131 may include a plurality of memory blocks. Each block may have a plurality of pages. Each page may be formed of a plurality of memory cells. The memory cells may be connected to a plurality of word lines WL and may be single-level memory cells each storing 1-bit data or multi-level memory cells each storing at least 2-bit data.

The memory cell array 131 includes a normal area 131a and a temporary area 131b. Since the areas 131a and 131b are described with reference to FIG. 1, the description thereof is thus omitted.

The address decoder 132 decodes an address ADDR received from the memory controller 120 and selects at least one of the word lines WL based on the decoded address. The selected word line is supplied with a voltage (e.g., a program voltage, a selection read voltage, or the like) under a control of the control logic 133. The address decoder 132 provides the page buffer 135 with a decoded column address DCA.

The control logic 133 controls operations of the nonvolatile memory device 130 in response to a write command CMD_w, a read command CMD_r, a suspend command CMD_spd, and a resume command CMD_rsm from a memory controller 120. For example, when the write command CMD_w is received, the control logic 133 controls the components 132, 135, and 136 such that data is written to the memory cell array 131. The control logic 133 outputs a ready/busy signal RnB indicating an operating state of the nonvolatile memory device 130.

The program loop managing unit 134 manages a program loop of the nonvolatile memory device 130. For example, the nonvolatile memory device 130 performs a program operation based on an ISPP (Incremental Step Pulse Program) manner. For example, the nonvolatile memory device 130 writes data to the normal area 131a of the memory cell array 131 by executing a plurality of program loops. The program loop managing unit 134 detects how many program loops of the nonvolatile memory device 130 are executed. For example, the program loop managing unit 134 detects the number of program loops executed. Alternatively, the program loop managing unit 130 may detect the number of remaining program loops. The remaining program loops indicate the number of remaining program loops of the maximum number of the program loops for the ISPP operation. For the convenience of a description, it is assumed that the program loop managing unit 134 detects the number of the remaining program loops, and the control logic 133 compares the number of the remaining program loops with the reference value.

The control logic 133 determines whether to interrupt a running program operation based on the number of program loops. For example, if the number of remaining program loops is greater than a reference value, the control logic 133 completes a running program loop, and then, performs a temporary program operation without performing the remaining program loops. In the temporary program operation, data stored in the page buffer 135 is stored in the temporary area 131b. The data stored in the temporary area 131b may correspond to data stored in the page buffer 135 after the running program loop is completed. The temporary data may include program verification results. After completing the temporary program operation, the control logic 133 sets the ready/busy signal RnB to a ready state.

If the number of remaining program loops is less than or equal to the reference value, the control logic 133 completes a running program operation, and then, sets the ready/busy signal RnB to a ready state. The reference value may be a predetermined value according to the temporary program time. For example, the temporary program time may be a time taken to perform 'i' program loops. In this case, the reference value may be set to 'i'. The control logic 133 may compare the number of remaining program loops with the reference value. Alternatively, the reference value may be a predetermined value according to the maximum number of program loops, the number of program loops executed (including a program loop being executed when a suspend command is received), or a temporary program time For example, the maximum number of program loops may be "n". The temporary program time may be a time taken to perform 'i' program loops. In this case, the reference value is set to (n−i) such that a time taken to perform remaining program loops is shorter than the temporary program time. In this case, the control logic 133 may compare the number of executed program loops with the reference value.

The page buffer 135 temporarily stores data received from the input/output circuit 136 or data read out from the memory cell array 131. The received data of the page buffer 135 may be updated after the execution of each program loop in a program operation. For example, to the received data of the page buffer 135 to memory cells of the normal area 131a, a plurality of program loops is executed in a sequence, and if the data stored in memory cells are verified in a program loop, the page buffer 135 may be updated with data "1" in the program loop. The data updated by performing each of the plurality of a program loops may be referred to as temporary data DATA_t. For example, the temporary data DATA_t may include program verification result data, and may be stored in the temporary area 131b. Alternatively, the temporary data DATA_t may be updated at receipt of a suspend command.

The input/output circuit 136 transmits data to the memory controller 120 or receives data from the memory controller 120.

Figure 3:
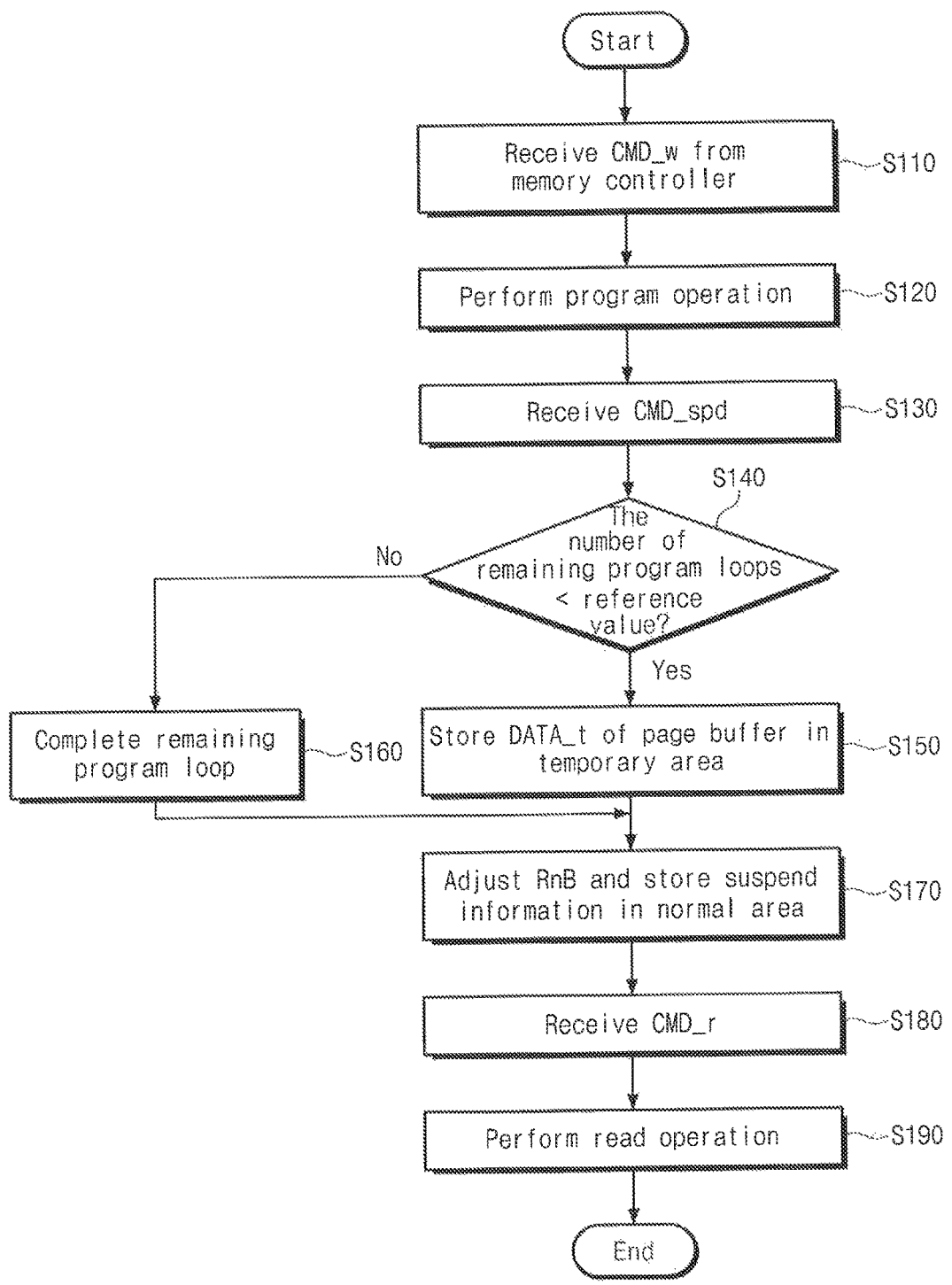
FIG. 3 is a flow chart schematically showing an operation of the nonvolatile memory device of FIG. 2, according to an exemplary embodiment of the inventive concept.

FIG. 3 is a flow chart schematically showing an operation of the nonvolatile memory device of FIG. 2, according to an exemplary embodiment of the inventive concept. Referring to FIGS. 1 to 3, in step S110, the nonvolatile memory device 130 receives a write command CMD_w from the memory controller 120. For example, the memory controller 120 may receive the write request RQ_w from the host 110. The memory controller 120 transmits a write command CMD_w to the nonvolatile memory device 130 in response to the write request RQ_w.

In step S120, the nonvolatile memory device 130 performs a program operation. For example, the nonvolatile memory device 130 performs the program operation in response to the write command CMD_w. The nonvolatile memory device 130 may set a ready/busy signal RnB to a busy state while performing the program operation.

In step S130, the nonvolatile memory device 130 receives a suspend command CMD_spd. For example, the memory controller 120 receives a read request RQ_r with high priority from the host 110. The memory controller 120 provides the nonvolatile memory device 130 with the suspend command CMD_spd, based on the read request RQ_r and the ready/busy signal RnB. For example, if the ready/busy signal RnB has a busy state, the memory controller 120 sends the suspend command CMD_spd to the nonvolatile memory device 130 to suspend the running program operation of the nonvolatile memory device 130.

In step S140, the nonvolatile memory device 130 determines whether the number of remaining program loops is greater than a reference value. For example, the nonvolatile memory device 130 performs a normal program operation according an ISPP manner where a plurality of program loops are executed. the program loop managing unit 134 of the nonvolatile memory device 130 detects the number of remaining program loops. The nonvolatile memory device 130 may determine whether the number of remaining program loops is greater than the reference value. For example, the reference value may be set to the number of program loops corresponding to a time equal to or longer than a temporary program operation time.

If the number of remaining program loops is greater than the reference value, step S150 is performed. In step S150, the nonvolatile memory device 130 stores temporary data DATA_t in a temporary area 131b. For example, the nonvolatile memory device 130 stores data being programmed (e.g., verification result data) in the temporary area 131b to suspend the running program operation. For example, the nonvolatile memory device 130 temporarily programs the temporary data DATA_t in the temporary area 131b. In the temporary program operation, the temporary data DATA_t is written to memory cells of the temporary area 131b using a higher program start voltage level, a larger program voltage increment, and a wider pulse width, as compared with a normal program operation. For example, the temporary program time may be shorter than a normal program time. For example, the temporary program time may be shorter than a program loop time corresponding to the reference value. If the number of remaining program loops is equal to or less than the reference value, step S160 is performed. In step S160, the nonvolatile memory device 130 completes the normal program operation being executed (i.e., completes the remaining program loops).

In step S170, the nonvolatile memory device 130 outputs the ready/busy signal RnB with a ready state and writes suspend information indicating whether the normal program operation is suspended, in a portion of the normal area 131a. The portion of the normal area 131a may be a spare area of a page where the normal program operation is executed.

In step S180, the nonvolatile memory device 130 receives a read command CMD_r. For example, the memory controller 120 receives the ready/busy signal RnB in step S170. The memory controller 120 provides the nonvolatile memory device 130 with the read command CMD_r corresponding to a read request RQ_r, based on the ready/busy signal RnB.

The nonvolatile memory device 130 provides the memory controller 120 with suspend information of whether a program operation is suspended. As described above, the suspend information may be stored in a spare area of a page where the suspended program operation is executed. Alternatively, suspend information may be stored in a separate storage circuit.

In step S190, the nonvolatile memory device 130 performs a read operation. For example, the nonvolatile memory device 130 performs a read operation in response to the read command CMD_r.

According to an exemplary embodiment, if the suspend command CMD_spd is received from the memory controller 120, the nonvolatile memory device 130 suspends the running program operation based on remaining program loops and a reference value to reduce latency of a request with high priority. Thus, reliability of the nonvolatile memory device 130 is increased. The nonvolatile memory device 130 stores temporary data DATA_t in the temporary area 131b to resume the suspended program resume operation later.

Figure 4:
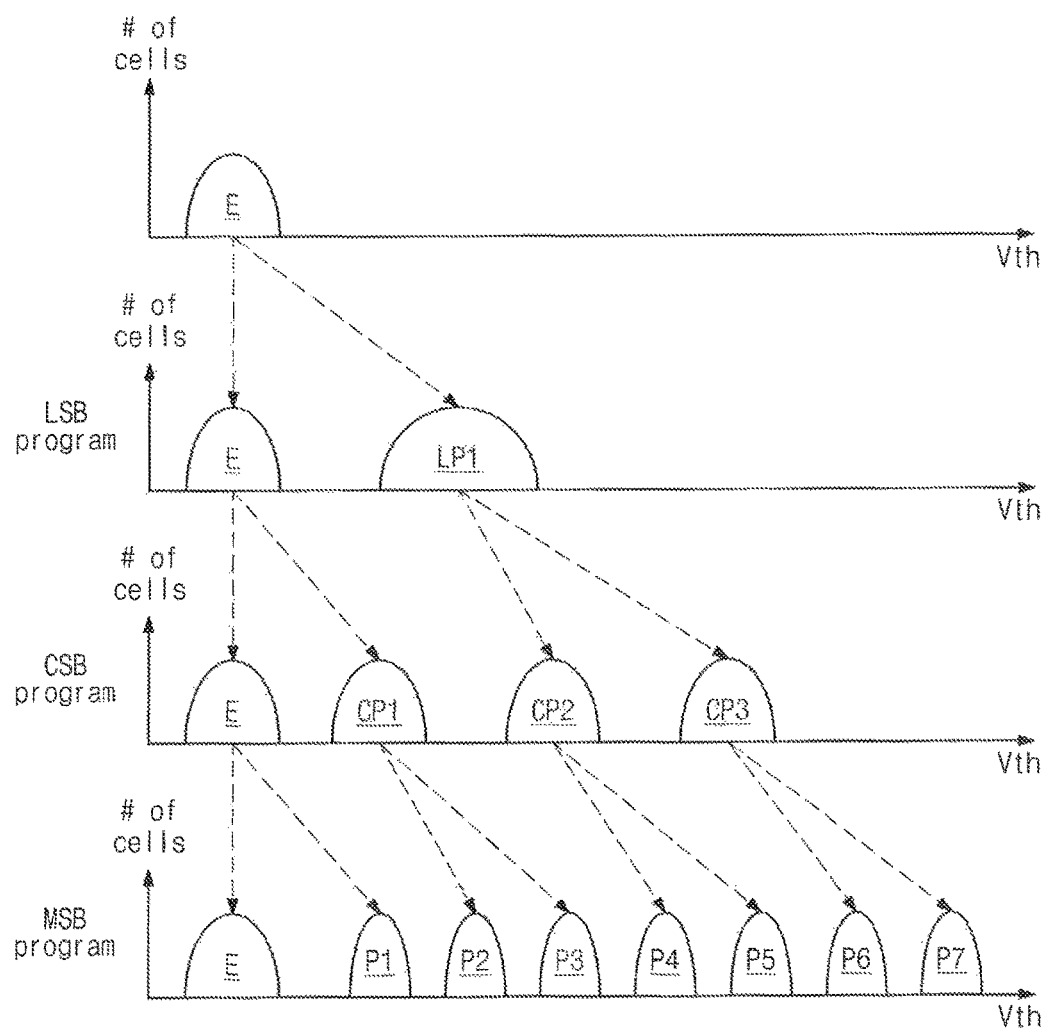
FIG. 4 is a diagram schematically showing threshold voltage distributions of memory cells for a normal program operation of the nonvolatile memory device of FIG. 2.
Figure 5:
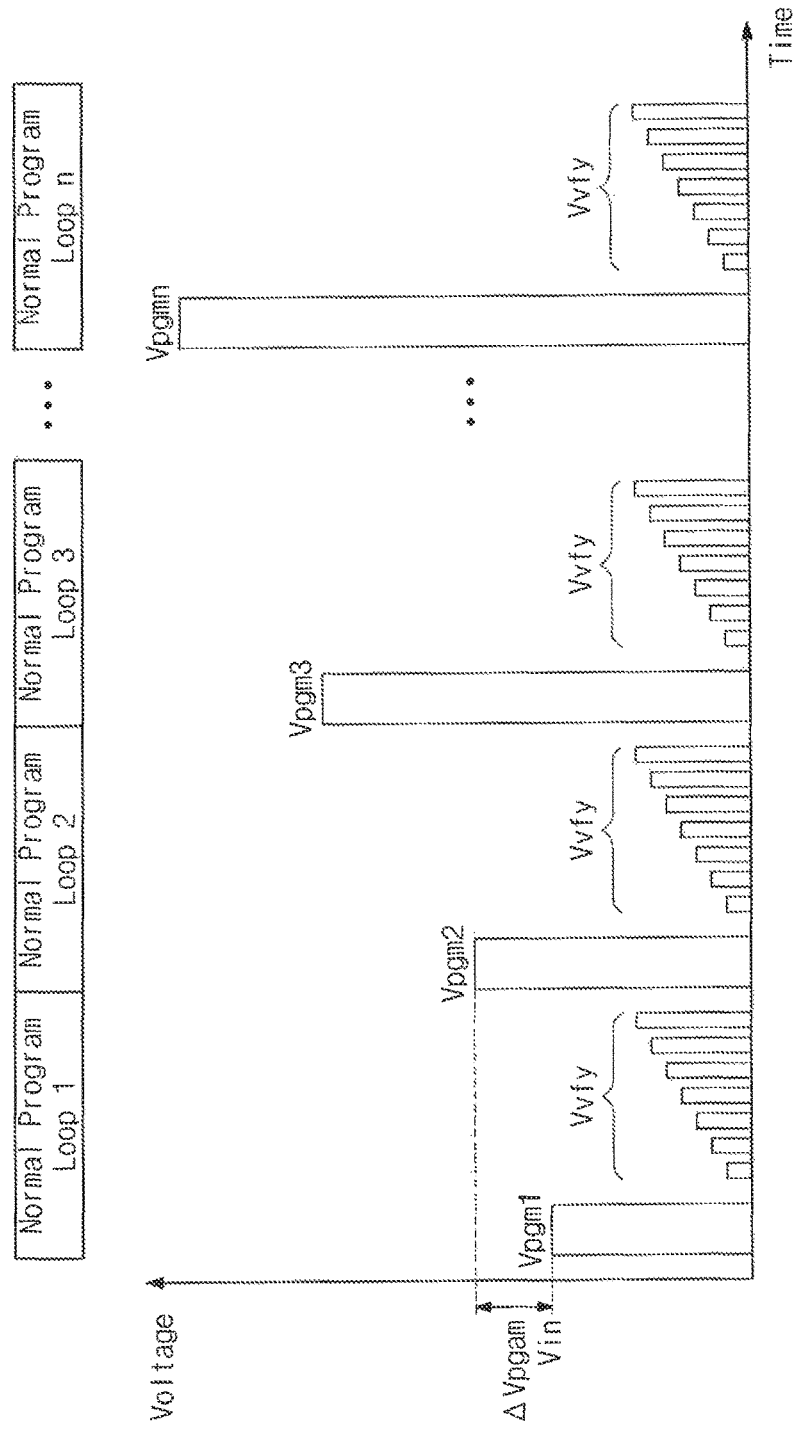
FIG. 5 is a diagram schematically showing voltages for performing MSB programming of FIG. 4.

FIG. 4 is a diagram schematically showing threshold voltage distributions of memory cells in a normal program operation of the nonvolatile memory device of FIG. 2. FIG. 5 is a diagram schematically showing voltages used for MSB programming shown in FIG. 4. In FIG. 5, an x-axis indicates a time, and a y-axis indicates a voltage level. For the convenience of a description, it is assumed that the nonvolatile memory device 130 includes multi-level memory cells each storing 3-bit data. Also, it is assumed that the nonvolatile memory device 130 performs a program operation by a page unit. However, the inventive concept is not limited thereto. For example, changes and modifications about a program manner and a data storage unit of the nonvolatile memory device may be made variously.

Referring to FIGS. 2, 4, and 5, the nonvolatile memory device 130 performs a program operation in the order of the least significant bit (LSB) data, center significant bit (CSB) data, and the most significant bit (MSB) data. The data to be programmed in a page unit may be divided into the LSB, CSB and MSB data according to a program algorithm. The nonvolatile memory device 130 writes LSB data in the memory cells connected to a selected word line, among memory ells of a memory cell array 131. At this time, programmed memory cells may have one of an erase state E and an LSB program state LP1.

Next, the nonvolatile memory device writes CSB data based on the LSB-programmed memory cells. At this time, CSB-programmed memory cells may have one of the erase state E and CSB program states CP1, CP2, and CP3.

Then, the nonvolatile memory device writes MSB data based on the CSB-programmed memory cells. At this time, MSB-programmed memory cells may have one of the erase state E and MSB program states P1, P2, P3, P4, P5, P6, and P7.

The nonvolatile memory device 130 performs an ISPP-based program operation. For example, the nonvolatile memory device 130, as shown in FIG. 5, performs a program operation through a plurality of program loops Program Loop 1 to Program Loop n. Each of the program loops is formed of a program operation and a verification operation. The program operation may be performed using a program voltage Vpgm. The verification operation may be performed using a plurality of verification voltages Vvfy that is sequentially applied. The program voltage Vpgm may be increased by an increment ΔVpgm according to an increase in the number of program loops. Memory cells passed during the verification operation are program inhibited during the next program loop.

Temporary data DATA_t includes the verification result of the verification operation. The temporary data DATA_t may be stored in the page buffer 135.

Figure 6:
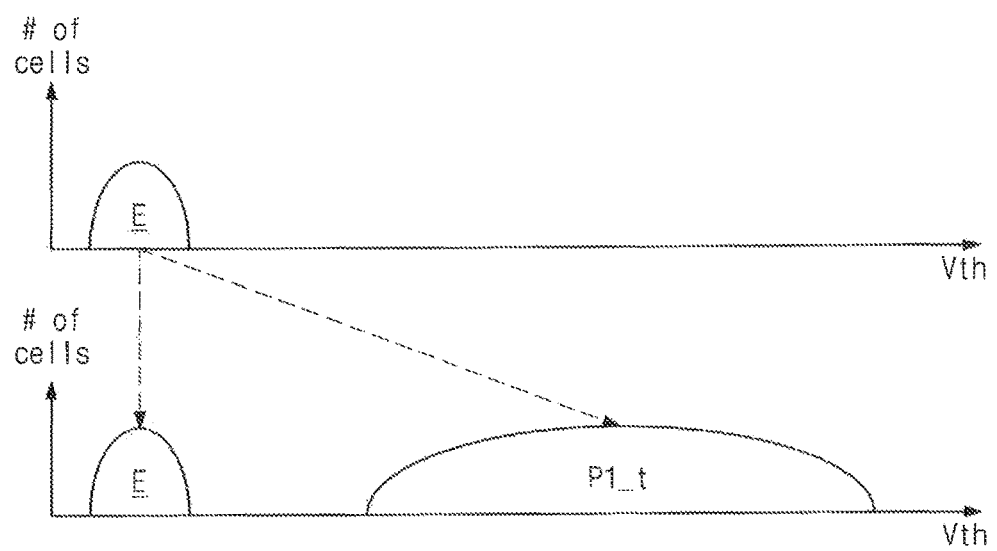
FIG. 6 is a diagram for showing a temporary program operation of the nonvolatile memory device of FIG. 2.
Figure 7:
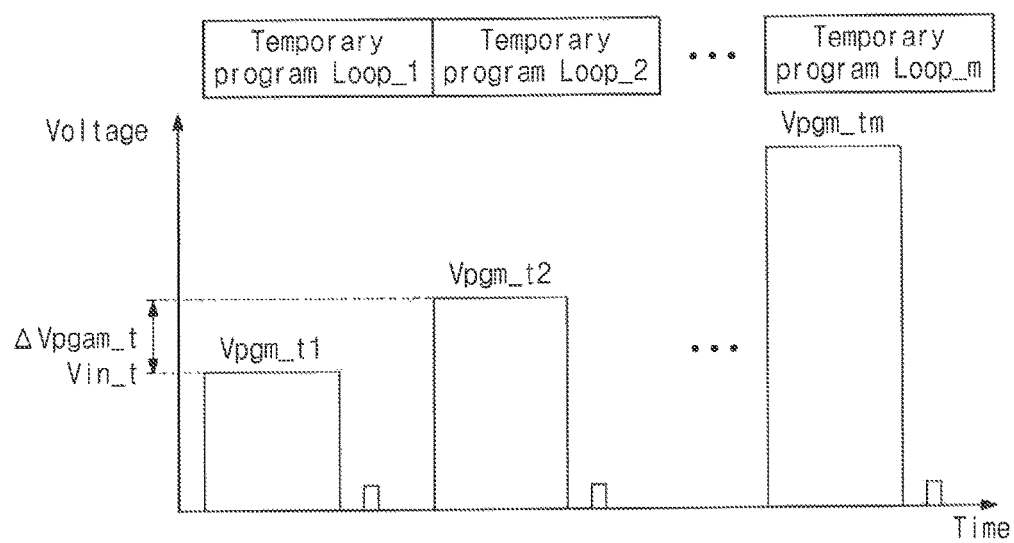
FIG. 7 is a diagram schematically showing voltages for the temporary program operation of FIG. 6, according to an exemplary embodiment of the inventive concept.

FIG. 6 is a diagram showing a temporary program operation of the nonvolatile memory device of FIG. 2. FIG. 7 is a diagram schematically showing voltages used in the temporary program operation shown in FIG. 6. In FIG. 7, an x-axis indicates a time, and a y-axis indicates a voltage level.

Referring to FIGS. 2 to 6, the nonvolatile memory device 130 interrupts a running program operation in response to a suspend command CMD_spd. After completing a program loop being executed at the receipt of the suspend command, temporary data DATA_t stored in the page buffer may be temporarily programmed in the temporary area 131b. For example, as shown in FIG. 5, temporary programmed memory cells may have an erase state E or a temporary program state P1_t.

The time taken to perform the temporary program operation may be shorter than a time taken to complete the remaining program loops of the normal program operation after the receipt of the suspend command.

A threshold voltage distribution of the temporary program state P1_t is wider than that of an LSB program state LP1 shown in FIG. 4. For example, as shown in FIG. 7, to program the temporary data DATA_t within a short time, the nonvolatile memory device 130 performs the temporary program operation using a high program start voltage, a great increment, and a wide program voltage pulse width, as compared with that of normal operation in shown FIG. 5.

Figure 8:
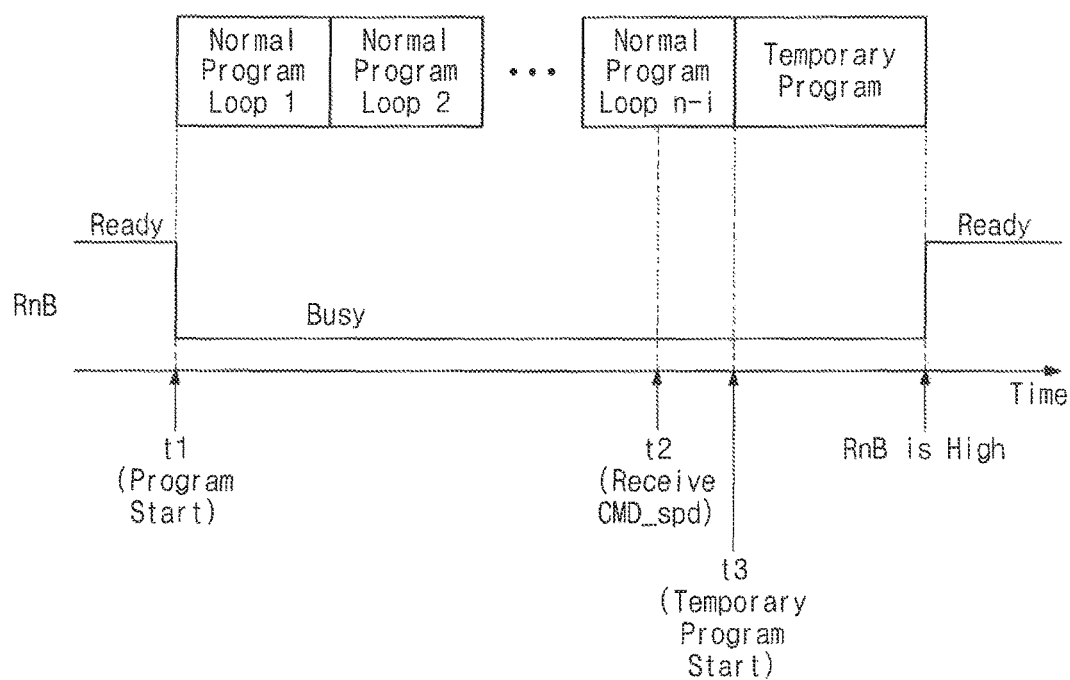
FIG. 8 is a timing diagram for showing a program interruption operation of the nonvolatile memory device of FIG. 2, according to an exemplary embodiment of the inventive concept.

FIG. 8 is a timing diagram showing a program interruption operation of the nonvolatile memory device shown in FIG. 2. Referring to FIGS. 2 and 8, at t1, a program operation of a nonvolatile memory device 130 commences. At t1, a ready/busy signal RnB transitions to a busy state. Afterward, the nonvolatile memory device 130 executes a plurality of program loops. At t2, the nonvolatile memory device 130 receives a suspend command CMD_spd from a memory controller 120. At this time, the nonvolatile memory device 130 compares the number of remaining program loops with a reference value to determine whether to interrupt the program operation currently executed.

For example, for the convenience of a description, it is assumed that a (n–i)th program loop of the nonvolatile memory device 130 is being executed at t2 when a suspend command CMD_spd is received. The remaining program loops to be suspended may include (n–i+1)th to nth program loops. Thus, the number of the remaining program loops is (i–1). If the number of the remaining program loops is greater than a reference value, a temporary program operation is performed after the completion of the (n–i)th program loop. For example, the nonvolatile memory device starts the temporary program operation at t3 without performing a (n–i+1)th program loop. After completing the temporary program operation, the nonvolatile memory device 130 sets the ready/busy signal RnB to a ready state at t4. Alternatively, the remaining programming loops may include the (n–i)th program loop being executed at the receipt of a suspend command CMD_spd.

For example, if the reference value is set to "1" and a program loop being executed is the last program loop, the nonvolatile memory device completes a running program operation. In contrast, if the reference value is set to "1" and a program loop being executed is not the last program loop, the nonvolatile memory device suspends the running program operation.

For example, if the number of the remaining program loops is smaller than the reference value (or, a time taken to perform the remaining program loops is shorter than ¶ a program loop time multiplied by the reference value), the nonvolatile memory device 130 completes the normal program operation being currently executed, and then, sets the ready/busy signal RnB to a ready state.

To perform a read operation with high priority, the memory controller 120 sends a read command CMD_r to the nonvolatile memory device 130 even when the nonvolatile memory device 130 is in a busy state of the ready/busy signal RnB having a logical high level.

Figure 9:
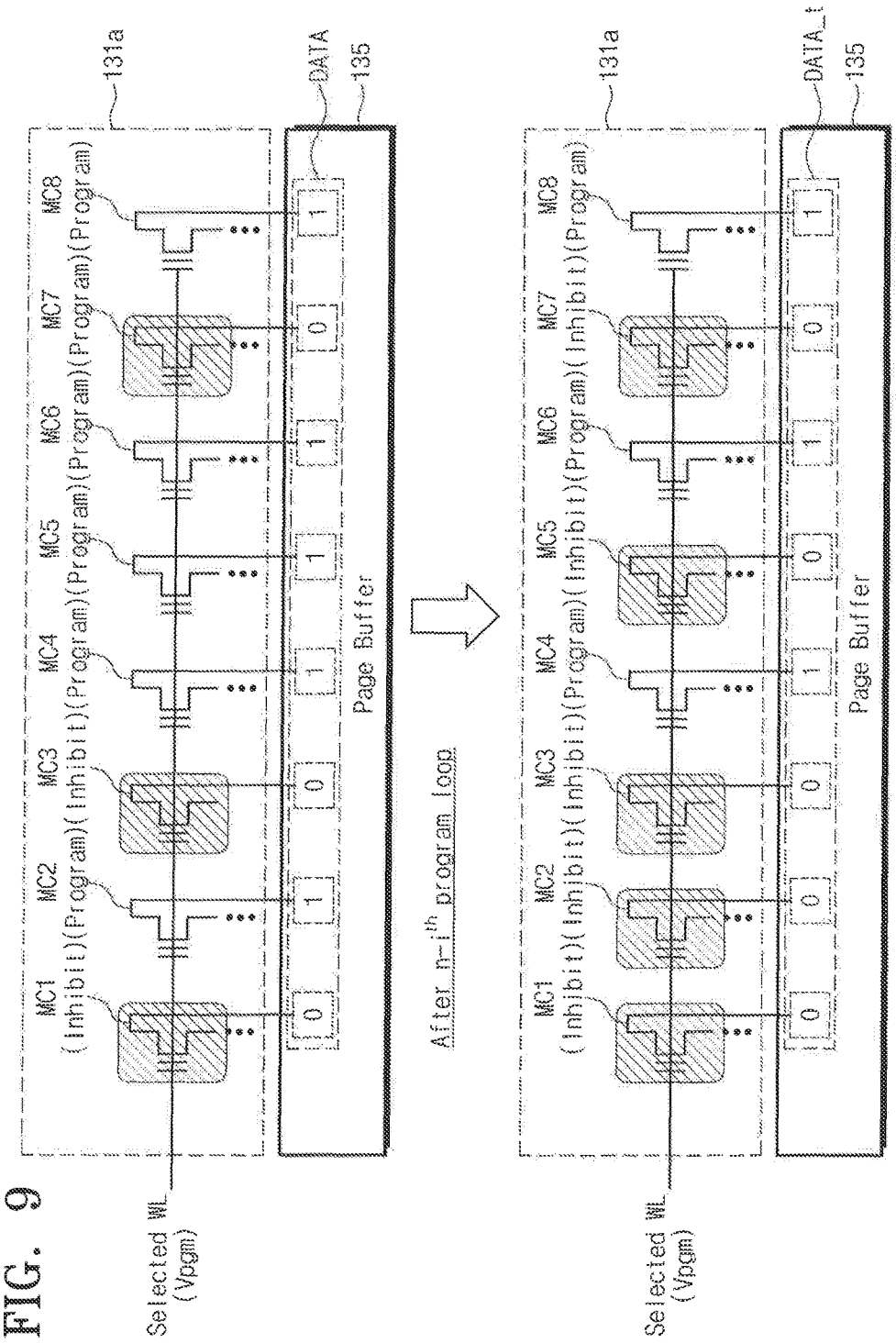
FIGS. 9 and 10 are diagrams for showing temporary data stored in a temporary area of FIG. 2.
Figure 10:
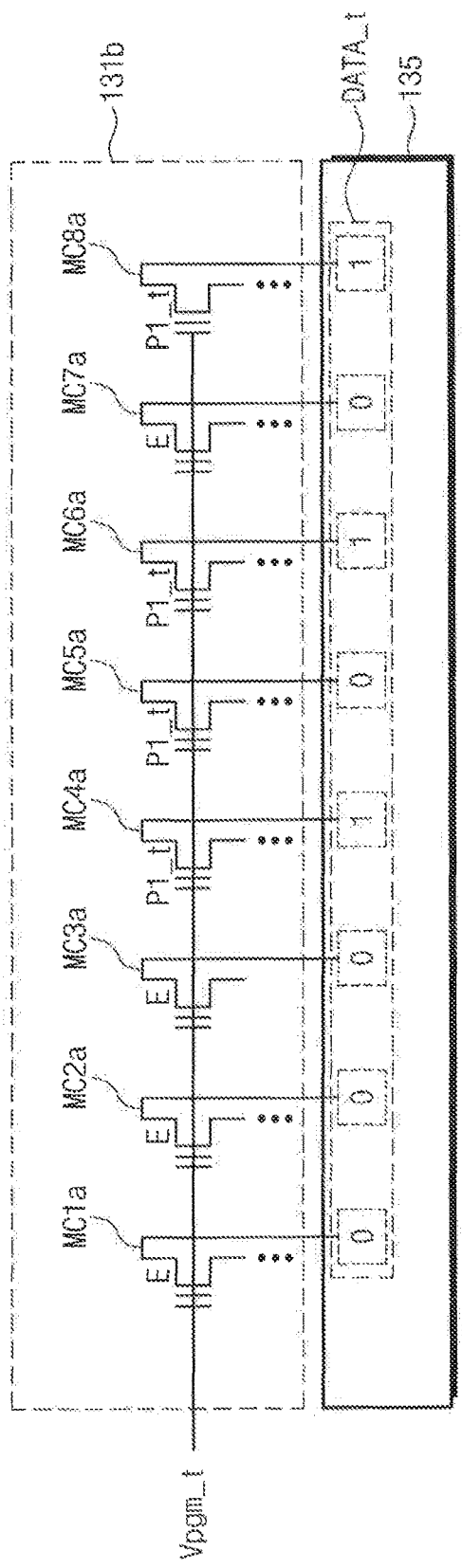

FIGS. 9 and 10 are diagrams showing of storing temporary data in the temporary area of FIG. 2. For the convenience of a description, in FIG. 9, memory cells connected to a selected word line are shown from a plurality of memory cells of a memory cell array 131. In FIG. 10, memory cells of the temporary area 131b configured to store temporary data DATA_t are shown.

It is assumed that first to eighth memory cells MC1 to MC8 are connected to a selected word line. However, the inventive concept is not limited thereto. Also, data corresponding to a page (e.g., an LSB page) is illustrated in FIGS. 9 and 10. However, the inventive concept is not limited thereto. For example, if memory cells are formed of 3-bit MLC, the temporary data DATA_t may include three pages of data. Also, the temporary data DATA_t may be stored in memory cells corresponding to three pages of the temporary area 131b shown in FIG. 10.

Referring to FIGS. 2 and 9, the first to eighth memory cells MC1 to MC8 are connected to a selected word line. A page buffer 135 includes data bits corresponding to the first to eighth memory cells MC1 to MC8. The nonvolatile memory device 130 performs a program operation to store data in the first to eighth memory cells MC1 to MC8. For the convenience of a description, it is assumed that a memory cell corresponding to a bit "0" is program inhibited and a memory cell corresponding to a bit "1" is programmed.

For example, data received from the memory controller 120 includes "01011101". The nonvolatile memory device 130 performs a program operation based on the received data. The nonvolatile memory device 130 performs a plurality of program loops. Data of the page buffer 135 may be updated according to a verification operation of each program loop.

The second and fifth memory cells MC2 and MC5 are program passed after an (n–i)th program loop being executed at the receipt of a suspend command CMD_spd. At this time, bits of the temporary data DATA_t corresponding to the second and fifth memory cells MC2 and MC5 are switched from "1" to "0".

The nonvolatile memory device 130, for example, receives a suspend command CMD_spd from the memory controller 120 while performing an operation of the (n–i)th program loop. As illustrated in FIG. 10, the nonvolatile memory device 130 temporarily programs the temporary data DATA_t stored in the page buffer 135 at a temporary area 131b in response to the suspend command CMD_spd. At this time, memory cells MC1a to MC8a of the temporary area 131b have one of an erase state E and a program state P1_t, as shown in FIG. 6, according to the temporary data DATA_t.

Although not shown in figures, if memory cells of a normal area 131a are 3-bit multi-level memory cells, memory cells of the temporary area 131b corresponding to three pages are required to store the temporary data DATA_t.

According to an exemplary embodiment of the inventive concept, the running program operation of a nonvolatile memory device is interrupted in response to a suspend command CMD_spd, and thus an operation having high priority may be performed prior to the completion of the running program operation. Accordingly, the latency of the operation with high priority is reduced. This may mean that reliability of the nonvolatile memory device 130 is increased.

The suspended program operation will be resumed later using the temporary data DATA_t stored in the temporary area 131b. When power-off occurs after the running program operation is suspended, the temporary data DATA_t may remain in the temporary area 131b. Thus, reliability of the nonvolatile memory device 130 is improved.

Figure 11:
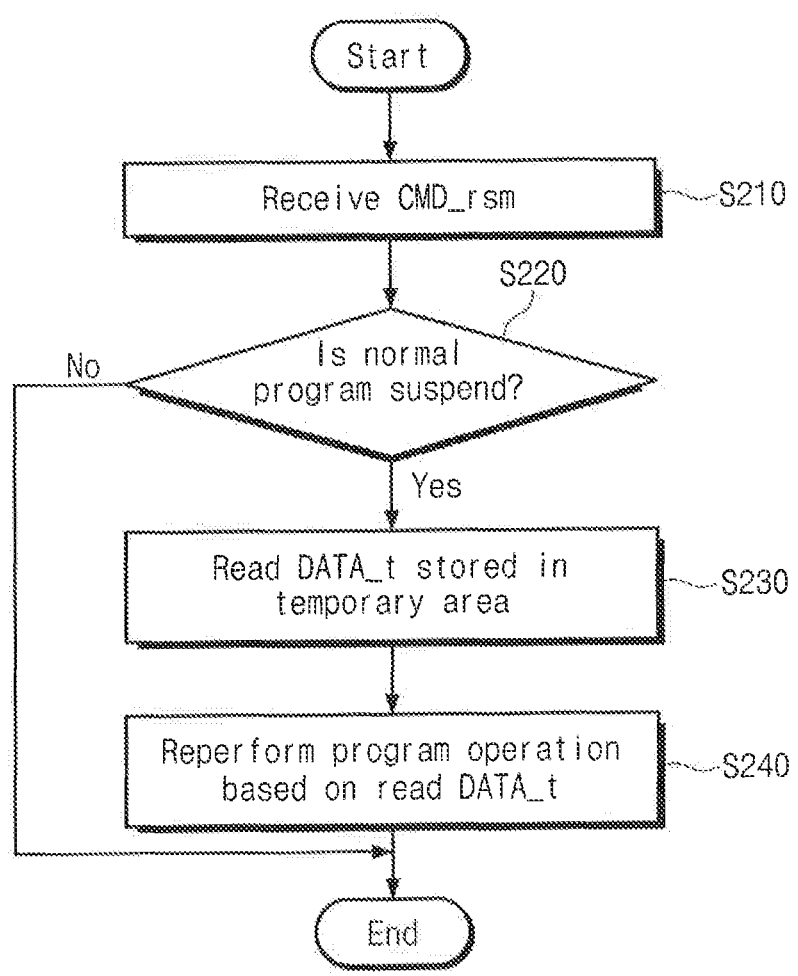
FIG. 11 is a flow chart schematically showing an operation of the nonvolatile memory device of FIG. 2, according to an exemplary embodiment of the inventive concept.

FIG. 11 is a flow chart schematically showing an operation of the nonvolatile memory device shown in FIG. 2, according to an exemplary embodiment of the inventive concept. A resume operation of the nonvolatile memory device 130 will be described with reference to FIG. 11. A resume operation may be performed after the read operation of step S190 shown in FIG. 3 is completed. However, the inventive concept is not limited thereto.

In step S210, the nonvolatile memory device 130 receives a resume command CMD_rsm. For example, after a read operation corresponding to a read request RQ_r with high priority is completed, a memory controller 120 provides a host 110 with a response to the read operation. After sending the response, the memory controller 120 provides the nonvolatile memory device 130 with the resume command CMD_rsm to complete the suspended program operation. For example, the memory controller may transmit an address ADDR corresponding to the suspended program operation to the nonvolatile memory device 130.

The resume command CMD_rsm may include information about the suspended program operation. For example, the resume command CMD_rsm may include information about whether the suspended program operation is an MSB program operation, a CSB program operation, or an LSB program operation.

In step S220, the nonvolatile memory device 130 determines whether a normal program operation is interrupted. For example, the nonvolatile memory device 130 determines whether a normal program operation is suspended, based on suspend information described with reference to step S170 shown in FIG. 3. Alternatively, the memory controller 120 may determine whether a normal program operation is interrupted. In this case, the memory controller 120 may receive the suspend information from the normal area 131a or the suspend information may be stored in the memory controller 120.

If it is determined that the normal program operation is suspended, the resume operation proceeds to step S230. In step S230, the nonvolatile memory device 130 reads temporary data DATA_t stored in the temporary area 131b. For example, the nonvolatile memory device 130 reads temporary data DATA_t from the temporary area 131b in response to the resume command CMD_rsm and stores the read temporary data DATA_t in the page buffer 135.

In step S240, the nonvolatile memory device 130 resumes the suspended program operation based on the temporary data DATA_t. For example, the temporary data DATA_t may include program verification results for a program loop executed at the receipt of the suspend command CMD_spd. The nonvolatile memory device 130 resumes the remaining program loops using the temporary data DATA_t. For example, the nonvolatile memory device 130, as described with reference to step S210, may resume performing the suspended program operation on a page corresponding to the received address ADDR. For example, the nonvolatile memory device 130 may perform a program operation on a program-suspended page in response to the resume command CMD_rsm.

If it is determined that the normal program operation is completed or there is no suspended program operation, the nonvolatile memory device 130 sends an interrupt signal to the memory controller 120. The memory controller 120 performs a new operation in response to the interrupt signal.

Figure 12:
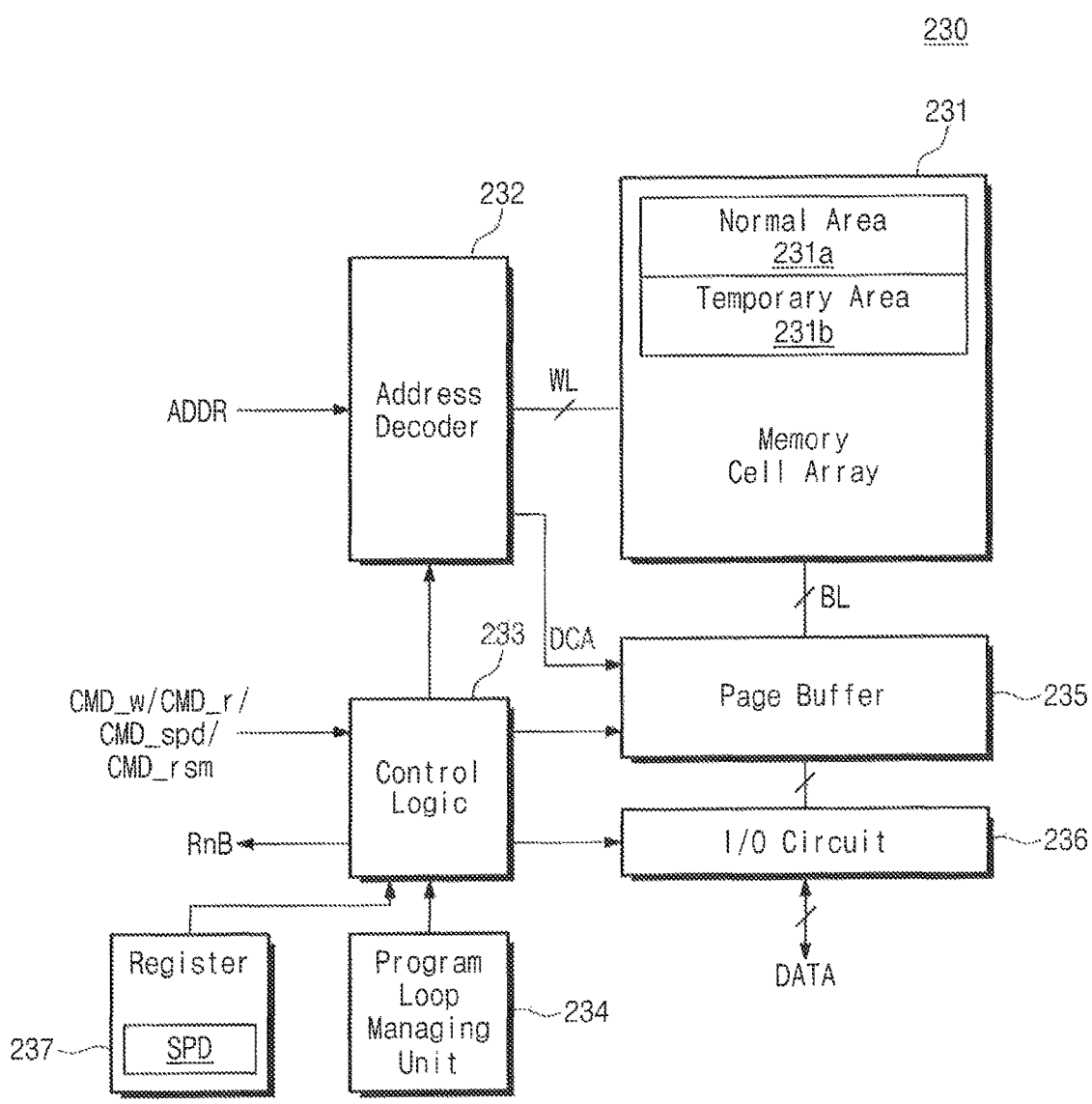
FIG. 12 is a block diagram schematically showing a nonvolatile memory device according to an exemplary embodiment of the inventive concept.

FIG. 12 is a block diagram schematically showing a nonvolatile memory device according to an exemplary embodiment of the inventive concept. Referring to FIG. 12, a nonvolatile memory device 230 includes a memory cell array 231, an address decoder 232, control logic 233, a program loop managing unit 234, a page buffer 235, an input/output circuit 236, and a register 237. In FIG. 12, the components 231 to 236 are configured substantially the same as those shown in FIG. 2, and a description thereof is thus omitted.

Unlike the nonvolatile memory device 130 shown in FIG. 2, the nonvolatile memory device 230 includes the register 237. The register 237 stores suspend information SPD indicating whether a normal program operation is suspended. The nonvolatile memory device 230 receives a resume command CMD_rsm from a controller 120 and checks the suspend information SPD stored in the register 237 in response to the resume command CMD_rsm. The nonvolatile memory device 230 determines whether a normal program operation is suspended, based on the suspend information SPD. The nonvolatile memory device 230 resumes a normal program operation according to the determination result.

According to an exemplary embodiment of the inventive concept, the nonvolatile memory device 230 includes the register 237 configured to store suspend information SPD indicating whether a normal program operation is suspended. The nonvolatile memory device 230 determines whether to resume the normal program operation based on the suspend information SPD stored in the register 237. Thus, performance and reliability of the nonvolatile memory device 230 are increased.

Figure 13:
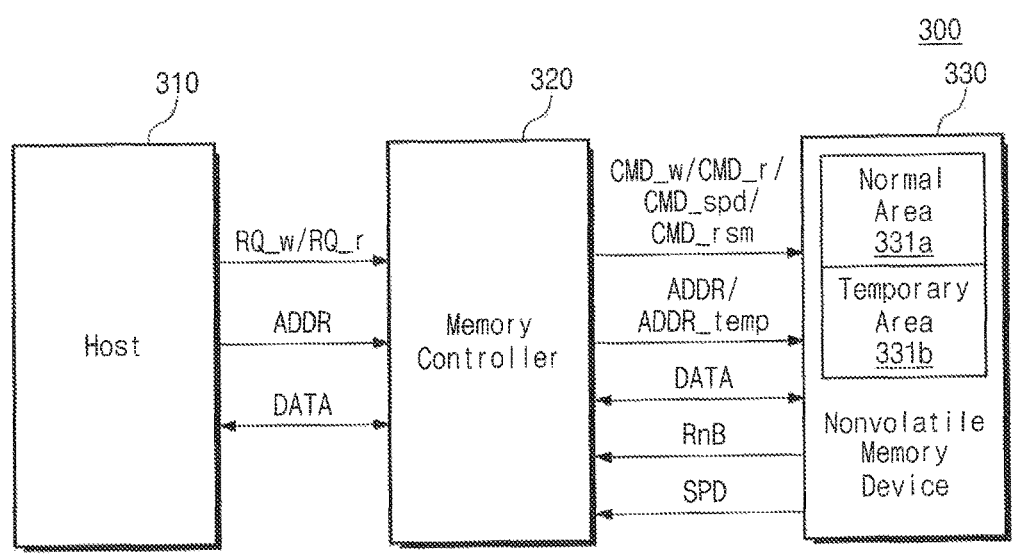
FIG. 13 is a block diagram schematically showing a user system according to an exemplary embodiment of the inventive concept.

FIG. 13 is a block diagram schematically showing an exemplary user system according to the inventive concept. Referring to FIG. 13, a user system 300 includes a host 310, a memory controller 320, and a nonvolatile memory device 330. The components 310, 320, and 330 are configured substantially the same as those described with reference to FIGS. 1 and 2, and a description thereof is thus omitted.

Unlike the memory controller 120 shown in FIG. 1, the memory controller 320 shown in FIG. 13 transmits a temporary address ADDR_temp to the nonvolatile memory device 330. The temporary address ADDR_temp may be an address corresponding to a temporary area 331b of the nonvolatile memory device 330 for storing temporary data DATA_t. For example, a memory cell array 131 of the nonvolatile memory device 330 is logically divided into a normal area 331a and the temporary area 331b. The memory controller 320 may manage addresses of the temporary area 331b that is logically divided.

In a suspended operation, the nonvolatile memory device 330 stores the temporary data DATA_t in a page (or, memory cells) corresponding to the temporary address ADDR_temp that is received when a normal program operation is suspended. The nonvolatile memory device 330 transmits suspend information SPD to the memory controller 320 when a normal program operation is suspended. The suspend information SPD may be information indicating whether a normal program operation is interrupted. In a resume operation, the memory controller 320 transfers a resume command CMD_rsm and a temporary address ADDR_temp to the nonvolatile memory device 330. The nonvolatile memory device 330 resumes a suspended program operation in response to the resume command CMD_rsm. When the suspended program operation is resumed, the nonvolatile memory device 330 reads the temporary data DATA_t from the temporary area 331b corresponding to the temporary address ADDR_temp. The nonvolatile memory device 330 resumes the suspended program operation based on the read temporary data DATA_t. As described above, the memory controller 320 manages the temporary area 331b that stores temporary data DATA_t when a program operation is suspended.

The memory controller 320 may provide the nonvolatile memory device 330 with a resume command CMD_rsm, based on the suspend information SPD from the nonvolatile memory device 330. For example, if a normal program operation is suspended, the memory controller 320 may receive the suspend information SPD from the nonvolatile memory device 330. After an operation with high priority is completed, the memory controller 320 transfers a resume command CMD_rsm for resuming the suspended normal program operation to the nonvolatile memory device 330 based on the suspend information SPD. The nonvolatile memory device 330 resumes the suspended normal program operation in response to the resume command CMD_rsm.

If a normal program operation is completed, the nonvolatile memory device 330 does not transfer the suspend information SPD to the memory controller 320. Alternatively, the nonvolatile memory device 330 may provide the memory controller 320 with program end information. In this case, the memory controller 320 does not send the resume command CMD_rsm to the nonvolatile memory device 330.

Figure 14:
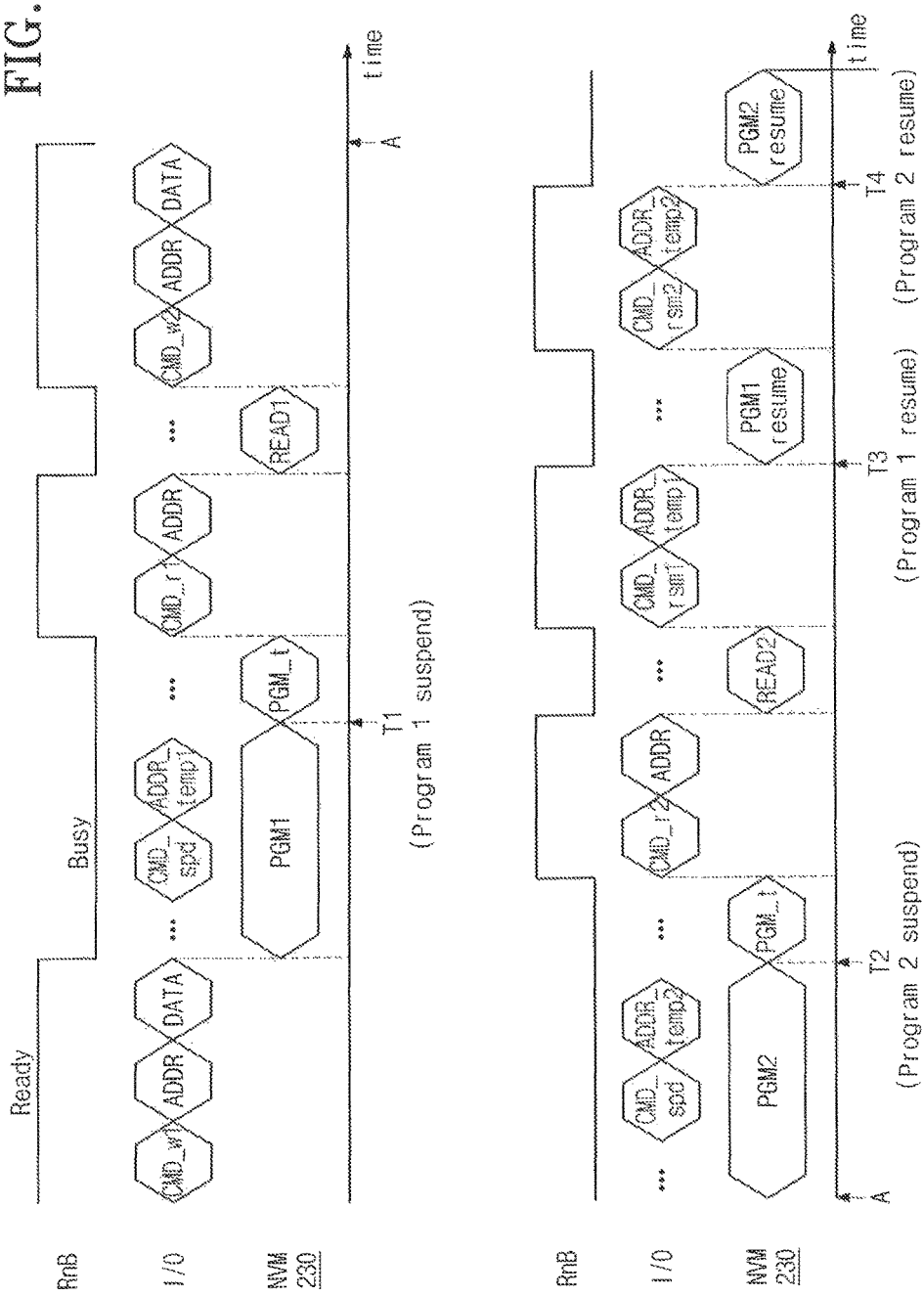
FIG. 14 is a timing diagram for operating a nonvolatile memory device and the memory controller of FIG. 13 according to an exemplary embodiment of the inventive concept.

FIG. 14 is a timing diagram for operating the nonvolatile memory device and the memory controller of FIG. 13. Referring to FIGS. 13 and 14, the memory controller 320 transfers a first write command CMD_w1, an address ADDR, and data to the nonvolatile memory device 330. The nonvolatile memory device 330 performs a first program operation PGM1 in response to the received signals. The memory controller 320 transmits a suspend command CMD_spd and a first temporary address ADDR_temp1 to the nonvolatile memory device 330 while the first program operation PGM1 is being performed. Based on the operating method described with reference to FIGS. 1 to 13, the nonvolatile memory device 330 writes temporary data DATA_t in a temporary area 331b corresponding to the first temporary address ADDR_temp1 in response to the suspend command CMD_spd. The first program operation PGM1 is suspended at T1, and the nonvolatile memory device 330 sets a ready/busy signal RnB to a ready state after a temporary program operation is completed. The nonvolatile memory device 330 sends suspend information SPD to the memory controller 320.

In response to the ready/busy signal RnB set to the ready state, the memory controller 320 transmits a first read command CMD_r1 and an address ADDR to the nonvolatile memory device 330. The nonvolatile memory device 330 performs a first read operation READ1 in response to the first read command CMD_r1. During the first read operation READ1, the ready/busy signal RnB is set to a busy state. After the first read operation READ1 is ended, the nonvolatile memory device 330 sets the ready/busy signal RnB to a ready state.

Afterwards, the memory controller 320 provides the nonvolatile memory device 330 with a second write command CMD_w2, an address ADDR, and data. The nonvolatile memory device 330 performs a second program operation PGM2. The ready/busy signal RnB is set to the busy state during the second program operation PGM2. For example, the second program operation PGM2 may be different from the first program operation PGM1. For example, an address and data for the second program operation PGM2 may be different from those for the first program operation PGM1.

During the second program operation PGM2, the memory controller 320 transmits a suspend command CMD_spd and a second temporary address ADDR_temp2 to the nonvolatile memory device 330.

Based on the operating method described with reference to FIGS. 1 to 13, the nonvolatile memory device 330 writes temporary data DATA_t in the temporary area 331b corresponding to the second temporary address ADDR_temp2 in response to the suspend command CMD_spd. The second program operation PGM2 is suspended at T2, and the nonvolatile memory device 330 sets the ready/busy signal RnB to a ready state after a temporary program operation is completed. The nonvolatile memory device 330 sends suspend information SPD to the memory controller 320.

In response to the ready/busy signal RnB set to the ready state, the memory controller 320 transmits a second read command CMD_r2 and an address ADDR to the nonvolatile memory device 330. The nonvolatile memory device 330 performs a second read operation READ2 in response to the second read command CMD_r2. During the second read operation READ2, the ready/busy signal RnB is set to a busy state. After the first second operation READ2 is ended, the nonvolatile memory device 330 sets the ready/busy signal RnB to a ready state.

In response to the ready/busy signal RnB set to the ready state, the memory controller 320 transmits a first resume command CMD_rsm1 and the first temporary address ADDR_temp1 to the nonvolatile memory device 330. When the first resume command CMD_rsm1 is received, the nonvolatile memory device 330 reads the temporary data DATA_t stored in the first temporary address ADDR_temp1 and resumes the first program operation PGM1 based on the read temporary data DATA_t. The ready/busy signal RnB is set to a busy state during the first program operation PGM1 resumed. The nonvolatile memory device 330 sets the ready/busy signal RnB to a ready state after the first program operation PGM1 is completed.

In response to the ready/busy signal RnB set to the ready state, the memory controller 320 transmits a second resume command CMD_rsm2 and the second temporary address ADDR_temp2 to the nonvolatile memory device 330. When the second resume command CMD_rsm2 is received, the nonvolatile memory device 330 reads temporary data DATA_t stored at the second temporary address ADDR_temp2 and resumes the second program operation PGM2 suspended, based on the read temporary data DATA_t. The ready/busy signal RnB is set to a busy state during the second program operation PGM2 resumed.

According to an exemplary embodiment of the inventive concept, the memory controller 320 manages addresses of the temporary area 331b. Since the memory controller 320 manages the temporary area 331b that stores the temporary data 331b upon program interruption, a plurality of temporary data may be stored in the temporary area 331b if a plurality of program operations are suspended. Also, the memory controller 320 checks whether normal program operations are completed based on the suspend information SPD from the nonvolatile memory device 330. Thus, at least one program operation may be suspended.

Figure 15:
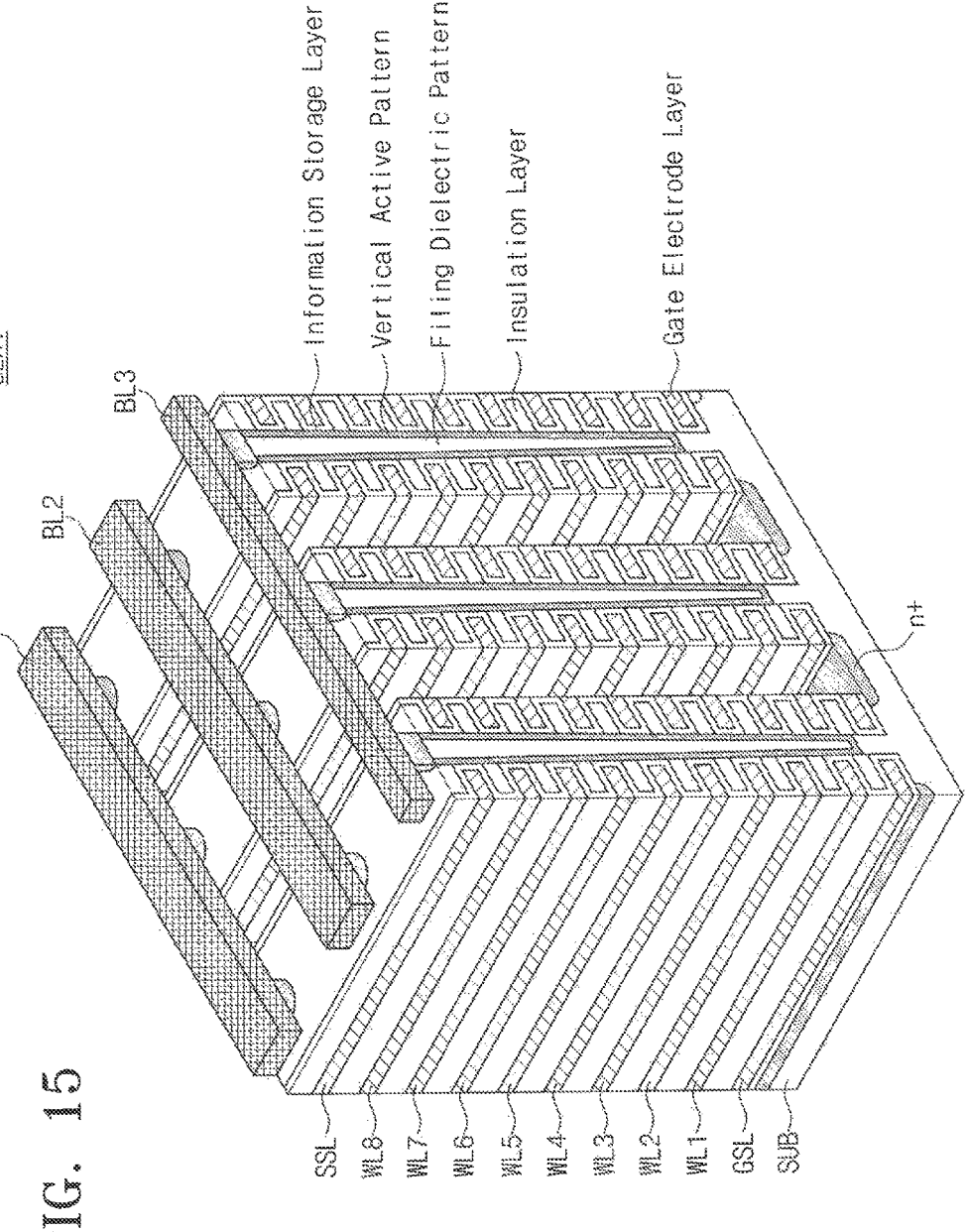
FIG. 15 is a perspective view schematically showing a three-dimensional structure of the memory cell array of FIG. 2, according to an exemplary embodiment of the inventive concept.

FIG. 15 is a perspective view schematically showing a three-dimensional structure of a memory cell array shown in FIG. 2, according to an exemplary embodiment of the inventive concept. For example, the memory cell array 131 of FIG. 2 is formed of a plurality of memory blocks BLK. In FIG. 14, an exemplary memory block BLK1 is shown. However, the inventive concept is not limited thereto.

Referring to FIG. 15, a memory block BLK1 includes gate electrode layers, insulation layers, vertical active patterns, information storage layers, etc. The memory block BLK1 is formed in a direction perpendicular to a substrate SUB. An n+ doping region is formed in the substrate SUB. Gate electrode layers and insulation layers are alternately deposited on the substrate SUB. A charge storage layer is formed between a gate electrode layer and an insulation layer.

If the gate electrode layers and the insulation layers are patterned in a vertical direction, V-shaped pillars are formed. The pillars are connected to the substrate SUB through the gate electrode layers and the insulation layers. An outer portion of the pillar may be formed of channel semiconductor as a vertical active pattern, and an inner portion thereof may be formed of an insulation material such as silicon oxide as a filing dielectric pattern.

The gate electrode layer of the memory block BLK1 is connected to a ground selection line GSL, a plurality of word lines WL1 to WL8, and a string selection line SSL. The pillars of the memory block BLK1 are connected to a plurality of bit lines BL1 to BL3. In FIG. 15, for the convenience of a description, one memory block BLK1 has two selection lines SSL and GSL, eight word lines WL1 to WL8, and three bit lines BL1 to BL3. However, the inventive concept is not limited thereto.

Figure 16:
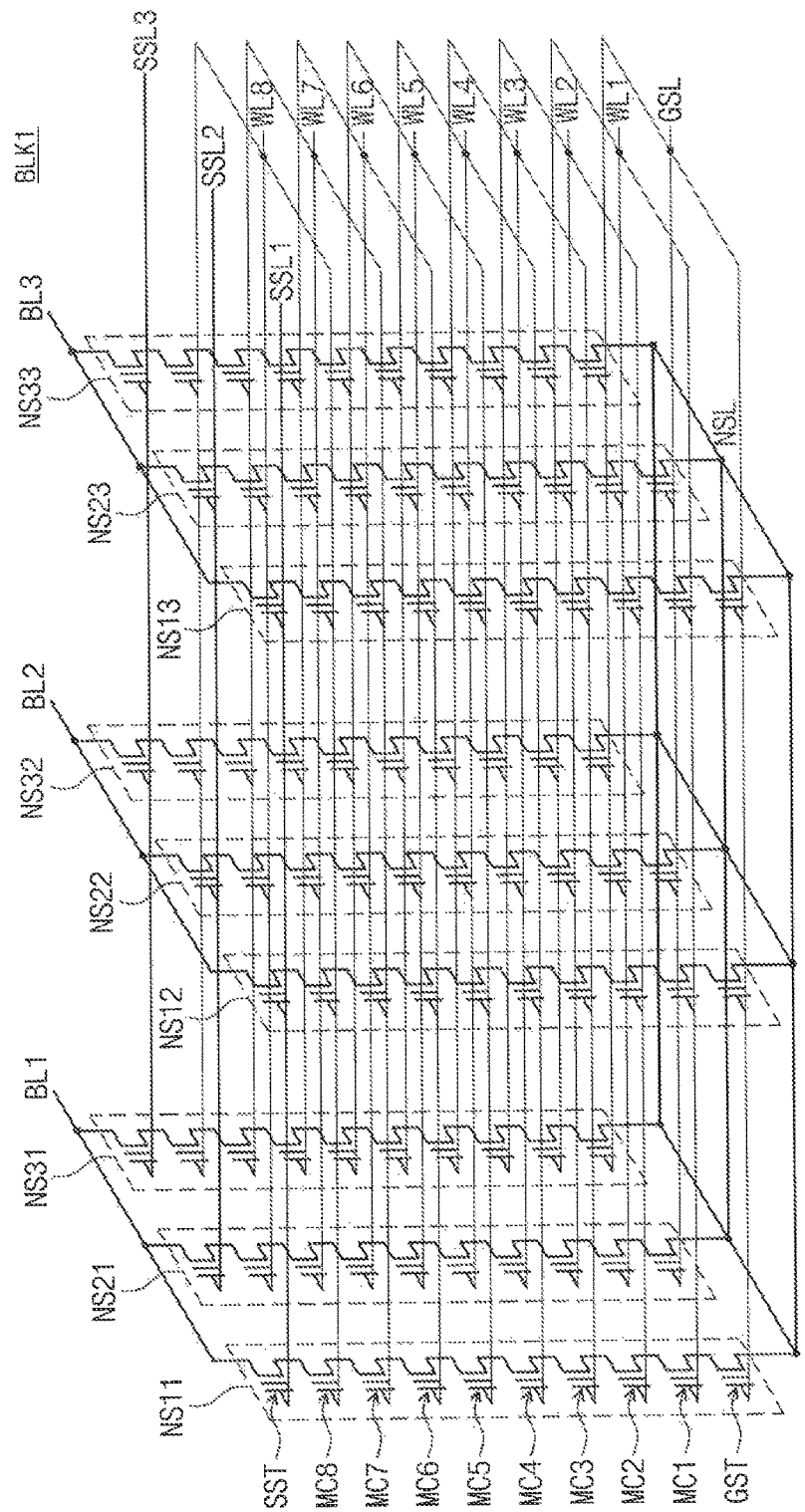
FIG. 16 is a circuit diagram schematically showing an equivalent circuit of the memory block of FIG. 15, according to an exemplary embodiment of the inventive concept.

FIG. 16 is a circuit diagram schematically showing an equivalent circuit of the memory block BLK1 shown in FIG. 15, according to an exemplary embodiment of the inventive concept. Referring to FIG. 16, NAND strings NS11 to NS33 are connected between bit lines BL1 to BL3 and common source lines CSL. Each NAND string (e.g., NS11) includes a string selection transistor SST, a plurality of memory cells MC1 to MC8, and a ground selection transistor GST.

The string selection transistors SST are connected to first to third string selection lines SSL1 to SSL3. In each NAND string, memory cells MC1 to MC8 are connected to corresponding word lines WL1 to WL8. The ground selection transistors GST are connected to a ground selection line GSL. In each NAND string, the string selection transistor SST is connected to a bit line, and the ground selection transistor GST is connected to a common source line CSL.

Word lines (e.g., WL1) with the same height are connected in common, and the string selection lines SSL1 to SSL3 are separated. A first word line WL1 and a first selection line SSL1 are selected to program memory cells that are connected to a word line WL1 and belong to NAND strings NS11, NS12, and NS13.

A nonvolatile memory device including a memory cell array that has a three-dimensional structure described with reference to FIGS. 14 and 15 may operate based on an operating method according to an exemplary embodiment of the present inventive concept.

Figure 17:
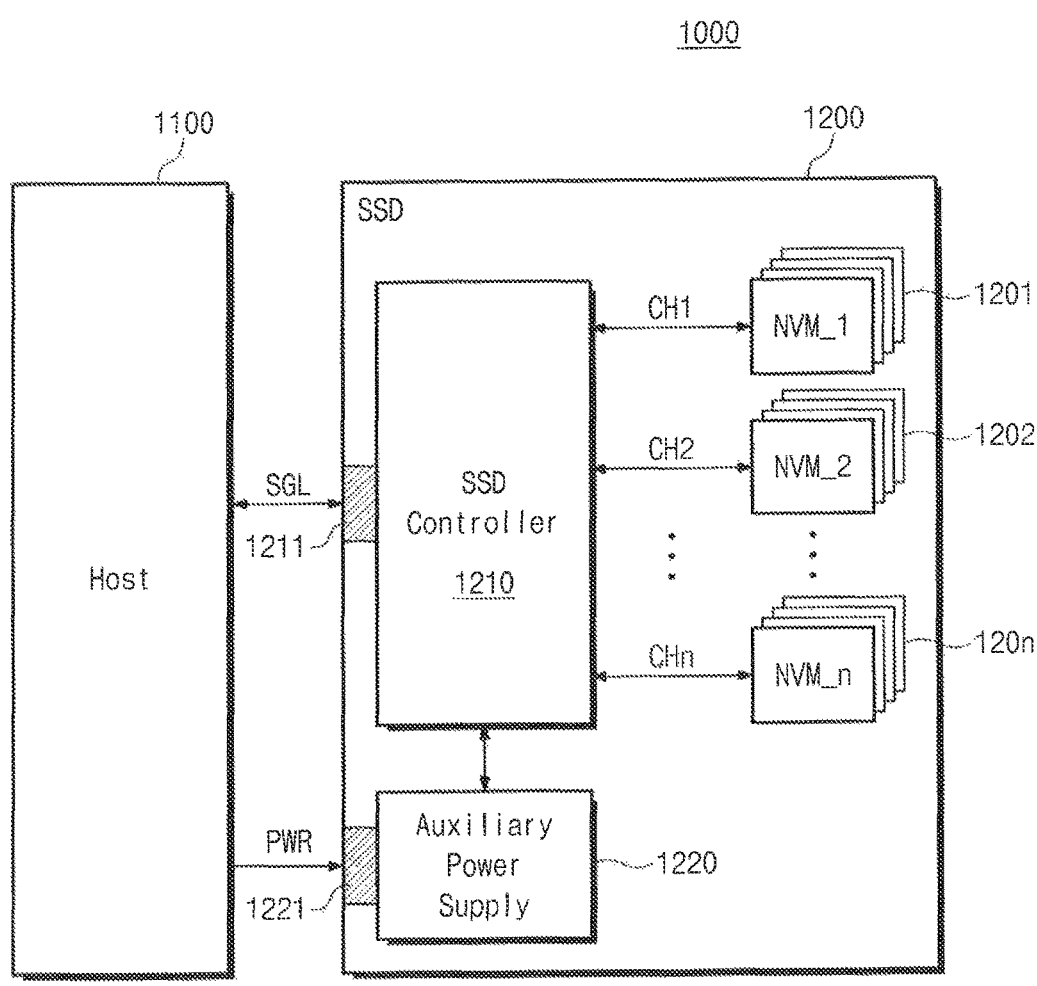
FIG. 17 is a block diagram showing an exemplary solid state drive according to the inventive concept.

FIG. 17 is a block diagram an exemplary solid state drive according to the inventive concept. Referring to FIG. 17, a solid state drive (SSD) system 1000 includes a host 1100 and an SSD 1200.

The host 1100 writes data to the SSD 1200 and reads data from the SSD 1200. The host controller 1120 sends signals SGL including a command, an address, state information, etc. to the SSD 1200 through the host interface 1211. The host 1100 exchanges the signals SGL with the SSD 1200 through the host interface 1211. For example, the host interface 1211 may include a variety of interfaces, such as USB (Universal Serial Bus), MMC (multimedia card), eMMC (embedded MMC) PCI (peripheral component interconnection), PCI-E (PCI-express), ATA (Advanced Technology Attachment), Serial-ATA, Parallel-ATA, SCSI (small computer small interface), ESDI (enhanced small disk interface), IDE (Integrated Drive Electronics), MIPI (Mobile Industry Processor Interface), UFS (Universal Flash Storage), NVMe (Nonvolatile Memory Express) and so on.

The SSD 1200 exchanges the signals SGL with the host 1100 through the host interface 1211 and is supplied with a power through a power connector 1221. The SSD 1200 includes a plurality of nonvolatile memories 1201 to 120n, an SSD controller 1210, and an auxiliary power supply 1220. The SSD 1200 may be implemented with not only a flash memory but also nonvolatile memory devices, such as a phase-change random access memory (PRAM) device, a magnetoresistive random access memory (MRAM) device, a resistive random access memory (ReRAM) device, a ferroelectric random access memory (FRAM) device, and so on.

The plurality of nonvolatile memories 1201 to 120n serves as a storage medium of the SSD 1200. The plurality of nonvolatile memories 1201 to 120n is connected to the SSD controller 1210 through a plurality of channels CHI to CHn. One channel may be connected to one or more nonvolatile memories. Nonvolatile memories connected to one channel may be connected to the same data bus.

The SSD controller 1210 exchanges the signals SGL with the host 1100 through the host interface 1211. Herein, the signals SGL may include a command, an address, data, etc. The SSD controller 1210 is configured to write or read out data to or from the nonvolatile memories 1201 to 120n according to a command of the host 1100.

The auxiliary power supply 1220 is connected to the host 1100 via the power connector 1221. The auxiliary power supply 1220 is charged by the power PWR supplied from the host 1100. The auxiliary power supply 1220 is placed inside the SSD 1200. Alternatively, the auxiliary power supply 1220 may be placed outside the SSD 1200. For example, the auxiliary power supply 1220 may be mounted on a main board to supply an auxiliary power to the SSD 1200.

The SSD controller 1210 and the nonvolatile memory device memory devices 1201 to 120n may operate based on the exemplary operating method described with reference to FIGS. 1 to 14.

Figure 18:
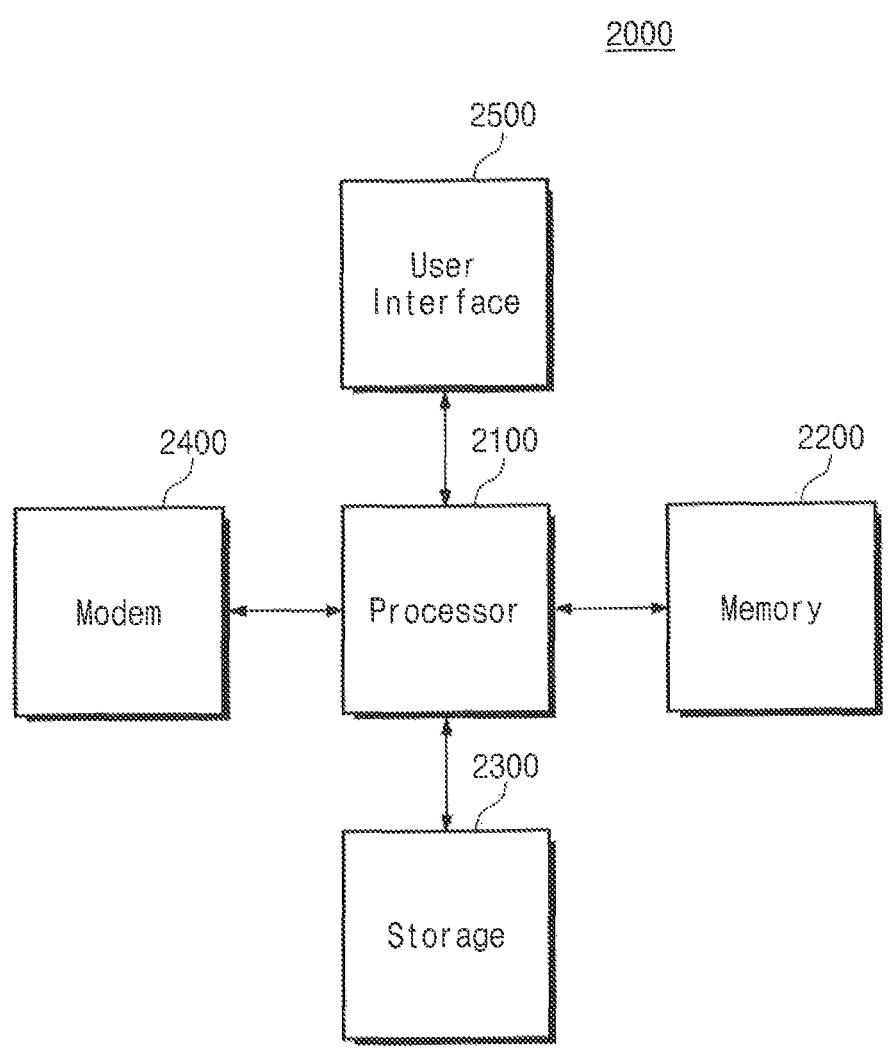
FIG. 18 is a block diagram schematically showing an exemplary user system according to the inventive concept.

FIG. 18 is a block diagram schematically showing an exemplary user system according to the inventive concept. Referring to FIG. 18, a user system 2000 includes an application processor 2100, a network module 2200, a storage module 2300, an input interface 2400, and an output interface 2500.

The application processor 2100 drives components of the user system 2000, an operating system, etc. For example, the application processor 2100 may include controllers for controlling components of the user system 2000, graphics engines, a variety of interfaces, etc.

The network module 2200 communicates with external devices. For example, the network module 2200 may support wireless communications, such as CDMA (Code Division Multiple Access), GSM (Global System for Mobile communication), WCDMA (wideband CDMA), CDMA-2000, TDMA (Time Division Multiple Access), LTE (Long Term Evolution), Wimax, WLAN, UWB, Bluetooth, WI-DI, and so on.

The storage module 2300 stores data. For example, the storage module 2300 stores data received from an external device. The storage module 2300 provides the application processor 2100 with data stored therein. For example, the storage module 2300 may be implemented with a semiconductor memory device, such as DRAM (Dynamic Random Access Memory), SDRAM (Synchronous DRAM), SRAM (Static RAM), DDR SDRAM (Double Date Rate SDRAM), DDR2 SDRAM, DDR3 SDRAM, PRAM, MRAM, ReRAM, NAND flash memory, or NOR flash memory.

The storage module 2300 may include an exemplary nonvolatile memory system described with reference to FIGS. 1 to 13 according to the inventive concept.

The input interface 2400 may provide an interface for receiving data or commands. For example, the input interface 2400 may be implemented with one of input devices, such as a camera, a touch screen, an operation recognition module, a microphone, and the like. The output interface 2500 may be implemented with one of output devices, such as a display, a speaker, a touch screen, and the like.

While the present inventive concept has been shown and described with reference to exemplary embodiments thereof it will be apparent to those of ordinary skill in the art that various changes in form and detail may be made therein without departing from the spirit and scope of the inventive concept as defined by the following claims.

What is claimed is:

1. A method of operating a nonvolatile memory comprising:
   storing data in a page buffer;
   performing a normal program operation on a plurality of multi-level memory cells using the data, wherein the normal program operation is performed by iterating a plurality of program loops, wherein the number of the plurality of program loops is M;
   receiving a suspend command while an Nth program loop is being executed, wherein N is less than M;
   if a time for completing the temporary program is equal to or less than a time for executing (M–N) program loops not executed before the receiving of the suspend command, performing a temporary program operation on a plurality of single-level memory cells using temporary data; and
   if the time for completing the temporary program is greater than the time for performing (M–N) program loops, performing an (N+1)th program loop.

2. The method of claim 1, further comprising, if the time for completing the temporary program is equal to er less than the time for executing (M–N) program loops, completing the Nth program loop including verifying whether the data is programmed in the plurality of multi-level memory cells and updating the data with the verifying result to generate temporary data, wherein the temporary program operation is performed using the temporary data.

3. The method of claim 1, further comprising receiving a read operation while the Nth program loop is being executed.

4. The method of claim 3, further comprising, if the time for completing the temporary program is equal to or less than the time for executing (M–N) program loops, suspending the (M–N) program loops and storing suspend information in the nonvolatile memory device, wherein the suspend information indicates that the normal program operation is suspended.

5. The method of claim 3, further comprising, if the time for completing the temporary program is equal to or less than the time for performing (M–N) program loops, suspending the (M−N) program loops of the normal program operation and storing suspend information indicating that the normal operation is suspended in a register, and further comprising receiving a resume command after the read operation is completed and completing the (M−N) program loops in response to the resume command using the temporary data.

6. A nonvolatile memory system comprising:

a nonvolatile memory device including a normal area and a temporary area and configured to perform a normal program operation having a plurality of program loops on the normal area using data and to perform a temporary program operation on the temporary area using temporary data; and a memory controller configured to issue a suspend command to the nonvolatile memory device based on a ready/busy signal from the nonvolatile memory device and a request for an operation with high priority from an external device, wherein the nonvolatile memory device is further configured to detect a number of remaining program loops when the nonvolatile memory device receives the suspend command from the memory controller, to compare the detected number of the remaining program loops with a reference value, and to suspend the remaining program loops of the normal program operation and perform the temporary program operation, and wherein the nonvolatile memory device is further configured to update the data to the temporary data including a verification result of each of the plurality of program loops being executed.

7. The nonvolatile memory system of claim 6, wherein the nonvolatile memory device is configured to store suspend information in the nonvolatile memory device if the normal program operation is suspended, wherein the suspend information indicates that the normal program operation is suspended.

8. The nonvolatile memory system of claim 7, wherein the memory controller is further configured to perform the operation with the high priority while the program operation is suspended and to issue a resume command after the operation with the high priority is completed, and wherein the nonvolatile memory device is further configured to resume the remaining program loops using the temporary data stored in the temporary area in response to the resume command.

9. The nonvolatile memory system of claim 6, wherein the memory controller is further configured to transmit a temporary address to the nonvolatile memory device, wherein the nonvolatile memory device stores the temporary data in memory cells of the temporary area, wherein the memory cells of the temporary area are selected based on the temporary address.

10. The nonvolatile memory system of claim 6, wherein if the number of the remaining program loops of the normal program operation is equal to or smaller than the reference value, the nonvolatile memory device performs the remaining program loops to complete the normal program operation, wherein if the number of the remaining program loops is greater than the reference value, the nonvolatile memory device performs the temporary program operation and suspends the normal program operation.

11. A nonvolatile memory device comprising:

a memory cell array including a normal area and a temporary area;

a page buffer configured to store data to be written to the normal area in a normal program operation and store temporary data to be written to the temporary area in a temporary program operation;

a control logic configured to perform the normal program operation including a plurality of program loops, to receive a suspend command before the normal program operation is completed, to determine, in response to the suspend command, whether to complete the normal program operation or whether to suspend the normal program operation and perform the temporary program operation based on a reference value representing a time for performing at least one program loop of the plurality of program loops, wherein the control logic is configured to set a ready/busy signal to a ready state after the temporary data stored in the pages buffer is programmed in the temporary area.

12. The nonvolatile memory device of claim 11, further comprising:

a program loop managing unit configured to detect the number of remaining program loops that represents the number of program loops not executed of the plurality of program loops in the normal program operation, wherein the control logic is further configured to receive the number of remaining program loops and to compare the number of remaining program loops and the reference value.

13. The nonvolatile memory device of claim 11, wherein the reference value is determined based on the maximum number of the plurality of program loops, the number of remaining program loops, and a temporary program time for programming of the temporary data.

14. The nonvolatile memory device of claim 11, wherein the normal area includes multi-level memory cells configured to store at least two data bits and the temporary area includes single-level memory cells configured to store one data bit.

15. The nonvolatile memory device of claim 11, further comprising:

a program loop managing unit configured to detect the number of remaining program loops that represents the number of program loops not executed of the plurality of program loops in the normal program operation, wherein the control logic is further configured to receive the number of remaining program loops and to compare the number of remaining program loops and the reference value, and wherein if the number of remaining program loops is greater than the reference value, the control logic is further configured to suspend the normal program operation and perform the temporary program operation to store the temporary data in the temporary area.

16. The nonvolatile memory device of claim 11, wherein if the normal program operation is suspended, the control logic is configured to store suspend information in the normal area, wherein the suspend information indicates that the normal program operation is suspended.

17. The nonvolatile memory device of claim 11, further comprising:

a register configured to store suspend information, wherein the suspend information indicates that the normal program operation is suspended.

18. The nonvolatile memory device of claim 11, further comprising:

a program loop managing unit configured to detect the number of remaining program loops that represents the number of program loops not executed of the plurality of program loops in the normal program operation, wherein the control logic is further configured to receive the number of remaining program loops and to compare the number of remaining program loops and the reference value, and wherein if the number of remaining program loops is smaller than the reference value, the control logic is configured to perform the remaining program loops to complete the normal program operation.

19. The nonvolatile memory device of claim 11, wherein the control logic is further configured to receive a resume command and to complete, in response to the resume command, the suspended normal program operation based on the temporary data.

* * * * *